United States Patent
Hirose

(10) Patent No.: US 10,631,446 B2
(45) Date of Patent: Apr. 21, 2020

(54) ELECTROMAGNETIC WAVE ABSORBER AND ELECTRONIC DEVICE

(71) Applicant: FUJITSU LIMITED, Kawasaki-shi, Kanagawa (JP)

(72) Inventor: Tatsuya Hirose, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/939,558

(22) Filed: Mar. 29, 2018

(65) Prior Publication Data

US 2018/0295756 A1 Oct. 11, 2018

(30) Foreign Application Priority Data

Apr. 7, 2017 (JP) .................................. 2017-076606

(51) Int. Cl.
*H05K 9/00* (2006.01)

(52) U.S. Cl.
CPC ......... *H05K 9/0024* (2013.01); *H05K 9/0081* (2013.01); *H05K 9/0084* (2013.01); *H05K 9/0086* (2013.01); *H05K 9/0088* (2013.01)

(58) Field of Classification Search
CPC .......................... H05K 9/0024; H05K 9/0081
USPC ....................................................... 361/818
See application file for complete search history.

(56) References Cited

U.S. PATENT DOCUMENTS

| | | | | |
|---|---|---|---|---|
| 5,160,807 A * | 11/1992 | Fry | ...................... | H05K 9/0033 174/372 |
| 6,054,647 A * | 4/2000 | Ridener | .................. | H05K 9/009 174/392 |
| 6,365,964 B1 * | 4/2002 | Koors | ................. | H01L 23/3675 257/707 |
| 6,703,707 B1 * | 3/2004 | Mamitsu | ............... | H01L 23/051 257/718 |
| 6,818,821 B2 * | 11/2004 | Fujieda | ................. | B82Y 10/00 174/394 |
| 7,129,422 B2 * | 10/2006 | Arnold | ................. | H05K 9/0024 174/377 |
| 8,472,189 B2 * | 6/2013 | Aslin | ...................... | B32B 15/12 361/700 |
| 9,510,452 B2 * | 11/2016 | Yumi | ..................... | H05K 1/181 |
| 2002/0109969 A1 * | 8/2002 | Wellhofer | ......... | G02F 1/133385 361/679.01 |
| 2006/0132014 A1 * | 6/2006 | Horiuchi | ................ | G02B 5/003 313/308 |
| 2009/0145581 A1 * | 6/2009 | Hoffman | ................... | F28F 1/40 165/80.3 |
| 2009/0179317 A1 * | 7/2009 | Iida | ..................... | B81C 1/00238 257/685 |
| 2009/0180251 A1 * | 7/2009 | Biagini | .............. | H05K 7/20918 361/690 |
| 2015/0245523 A1 * | 8/2015 | Takagi | .................. | H02M 7/003 361/715 |
| 2018/0166777 A1 * | 6/2018 | Joung | ..................... | H01Q 1/42 |

FOREIGN PATENT DOCUMENTS

JP 2014-229727 12/2014

* cited by examiner

*Primary Examiner* — Hung S. Bui

(74) *Attorney, Agent, or Firm* — Fujitsu Patent Center

(57) ABSTRACT

An electromagnetic wave absorber includes: a first layer having a first enclosing layer that encloses an electromagnetic wave radiator, and a first metal film formed on the first enclosing layer.

14 Claims, 16 Drawing Sheets

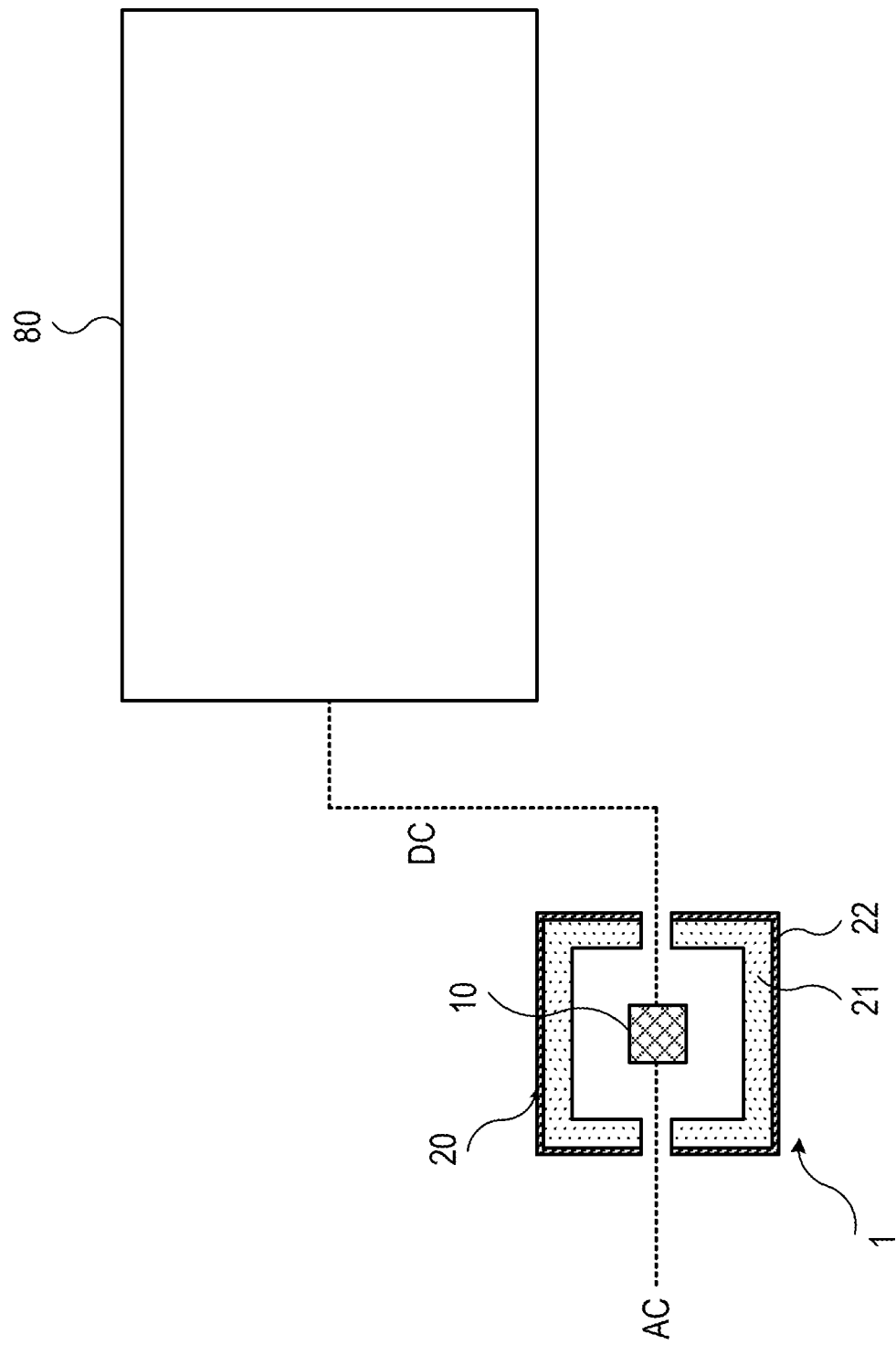

ELECTROMAGNETIC WAVE ABSORBER AND ELECTRONIC DEVICE

CROSS-REFERENCE TO RELATED APPLICATION

This application is based upon and claims the benefit of priority of the prior Japanese Patent Application No. 2017-076606, filed on Apr. 7, 2017, the entire contents of which are incorporated herein by reference.

FIELD

The embodiments discussed herein are related to an electromagnetic wave absorber and an electronic device.

BACKGROUND

There has been known an electronic device such as an alternating current (AC) adapter (a power supply device) which is accommodated in a housing to connect a circuit board mounted with a heat generating element such as a field effect transistor (FET) to the outside. Further, there has been known a technique using a housing formed by a resin molding as the housing of the electronic device.

Related technologies are disclosed in, for example, Japanese Laid-Open Patent Publication No. 2014-229727.

SUMMARY

According to an aspect of the embodiments, provided is an electromagnetic wave absorber including: a first layer having a first enclosing layer that encloses an electromagnetic wave radiator, and a first metal film formed on the first enclosing layer.

The object and advantages of the disclosure will be realized and attained by means of the elements and combinations particularly pointed out in the claims. It is to be understood that both the foregoing general description and the following detailed description are exemplary and explanatory and are not restirctive of the disclosure, as claimed.

BRIEF DESCRIPTION OF DRAWINGS

FIG. 16 is an explanatory view of an electronic device according to a ninth embodiment.

DESCRIPTION OF EMBODIMENTS

Electromagnetic waves may be radiated from an electronic device during the operation of the electronic device. When the resin molding is used as the member for enclosing the electronic device radiating the electromagnetic waves, there may be problems in that the radiation of the electromagnetic waves to the outside is not suppressed, and the electromagnetic waves become noise and affect the operation of peripheral electronic equipment.

Figure 1:
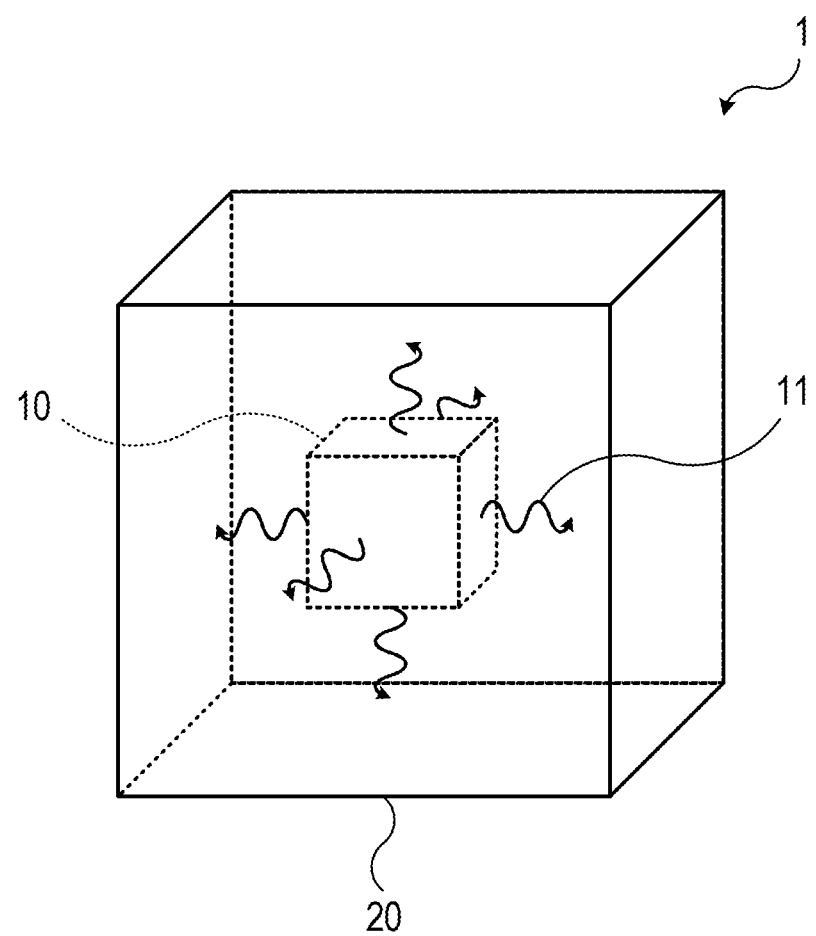
FIG. 1 is an explanatory view of an electronic device according to a first embodiment.

First, a first embodiment will be described. FIG. 1 is an explanatory view of an electronic device according to the first embodiment. As illustrated in FIG. 1, an electronic device 1 includes an electromagnetic wave radiator 10 and a layer 20 formed to enclose the electromagnetic wave radiator 10.

The electromagnetic wave radiator 10 includes, for example, a circuit board and an electronic component such as a semiconductor element mounted on the circuit board, and radiates electromagnetic waves 11 by the operation of the electronic component. Here, when the electromagnetic waves 11 radiated from the electromagnetic wave radiator 10 are radiated to the outside of the electronic device 1, the electromagnetic waves 11 may become noise and cause malfunction of other electronic components, electronic apparatuses, or electronic equipment provided in the periphery of the electronic device 1. In the electronic device 1, the layer 20 is provided as an electromagnetic wave absorber to enclose the electromagnetic wave radiator 10, so as to suppress the electromagnetic waves 11 radiated from the electromagnetic wave radiator 10 from being radiated to the outside of the electronic device 1.

Figure 2A:
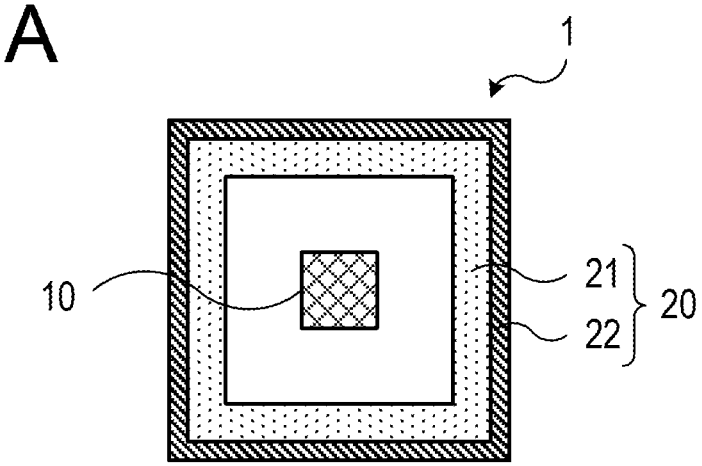
FIGS. 2A to 2C are views illustrating an example of a configuration of the electronic device according to the first embodiment.
Figure 2B:
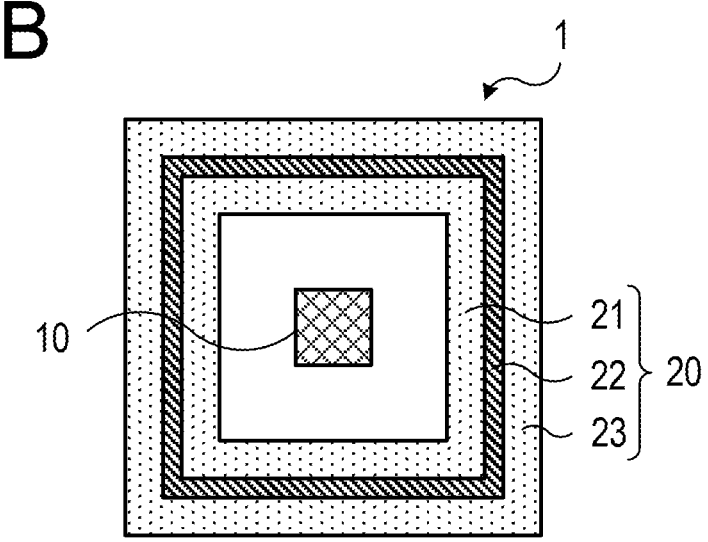
Figure 2C:
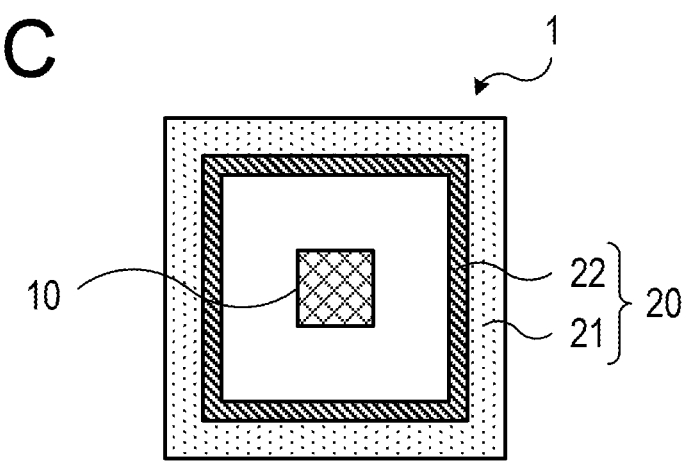

The layer 20 of the electronic device 1 will be described with reference to FIGS. 2A to 2C. FIGS. 2A to 2C are views illustrating an example of a configuration of the electronic device according to the first embodiment. Each of FIGS. 2A to 2C schematically illustrates a sectional view of the main part of the electronic device.

As illustrated in FIG. 2A, for example, the layer 20 includes a first enclosing layer 21 that encloses the electromagnetic wave radiator 10, and a metal film 22 formed on the outer surface of the first enclosing layer 21 (which is opposite to the side of the electromagnetic wave radiator 10).

As for the first enclosing layer 21, various insulating materials are used. For example, various resin materials such as acrylonitrile-butadiene-styrene copolymer (ABS resin), polylactic acid (PLA resin), epoxy resin, polyphenylene ether, and polyethylene terephthalate are used for the first enclosing layer 21. As for the metal film 22, various metal materials are used. For example, aluminum is used for the metal film 22. For example, metal such as iron, nickel or chromium, or an alloy containing nickel and chromium may be used for the metal film 22. A material having a lower resistivity than ferrite may be used for the metal film 22.

As illustrated in FIG. 2B, for example, the layer 20 may further include a second enclosing layer 23 formed on the outer surface of the metal film 22 to enclose the electromagnetic wave radiator 10. As for the second enclosing layer 23, various insulating materials are used. For example, various paints or coating materials other than the same resin material as that of the inner first enclosing layer 21 are used for the second enclosing layer 23.

As illustrated in FIG. 2C, for example, the layer 20 may have a structure including the first enclosing layer 21 that encloses the electromagnetic wave radiator 10, and the metal film 22 formed on the inner surface of the first enclosing layer 21 (which faces the side of the electromagnetic wave radiator 10).

The layer 20 illustrated in each of FIGS. 2A to 2C may be used as a housing for accommodating the electromagnetic wave radiator 10 of the electronic device 1. In the electronic device 1 in which the layer 20 is formed to enclose the electromagnetic wave radiator 10, the electromagnetic waves radiated from the electromagnetic wave radiator 10 are incident on the first enclosing layer 21 and further incident on the metal film 22. The electromagnetic waves incident on the metal film 22 become currents which flow through the metal film 22. The currents flowing through the metal film 22 are converted into thermal energy (Joule heat) by the resistance of the metal film 22. In this way, the electromagnetic waves incident on the metal film 22 are lost. That is, the electromagnetic waves are absorbed by the metal film 22. As a result of the absorption of the electromagnetic waves by the metal film 22, the electromagnetic waves from the electromagnetic wave radiator 10 are suppressed from being radiated to the outside of the electronic device 1, and also suppressed from being reflected on the metal film 22 and affecting the operation of the electromagnetic wave radiator 10.

In the layer 20 of the electronic device 1, since the metal film 22 has resistance, currents flow when the electromagnetic waves are incident on the metal film 22, and the currents are converted into thermal energy by the resistance so that the electromagnetic waves are absorbed. However, as the resistance of the metal film 22 increases, currents hardly flow even when the electromagnetic waves are incident. Thus, the efficiency of the conversion of the electromagnetic waves into thermal energy decreases, and the absorption efficiency decreases. Therefore, in the electronic device 1, a type and a resistance of the material used for the metal film 22 are selected or adjusted based on the required electromagnetic wave absorption characteristic of the layer 20.

For example, the resistance is selected or adjusted according to a type of the material used for the metal film 22. In addition, the resistance increases when the thickness of the material for the metal film 22 is thin, as compared with a case where the thickness of the same material is thick. Further, the resistance increases when a predetermined pattern is formed by forming, for example, an opening on the metal film 22 as described later, as compared with a case where no pattern is formed. The resistance may be selected or adjusted according to the thickness or pattern of the metal film 22 as described above.

In the electronic device 1, the electromagnetic wave radiator 10 is enclosed by the first enclosing layer 21, and the metal film 22 is formed on the surface of the first enclosing layer 21. Thus, the electromagnetic waves from the electromagnetic wave radiator 10 are absorbed by the metal film 22. As a result, the radiation of the electromagnetic waves to the outside of the electronic device 1 is suppressed, and as a result, the malfunction of, for example, peripheral electronic equipment and the malfunction of the electromagnetic wave radiator 10 enclosed by the layer 20 are suppressed. In the electronic device 1, an increase in weight, and furthermore, an increase in costs are suppressed, as compared with a case where the electromagnetic wave radiator 10 is enclosed by a metal member such as a metal housing.

Figure 3:
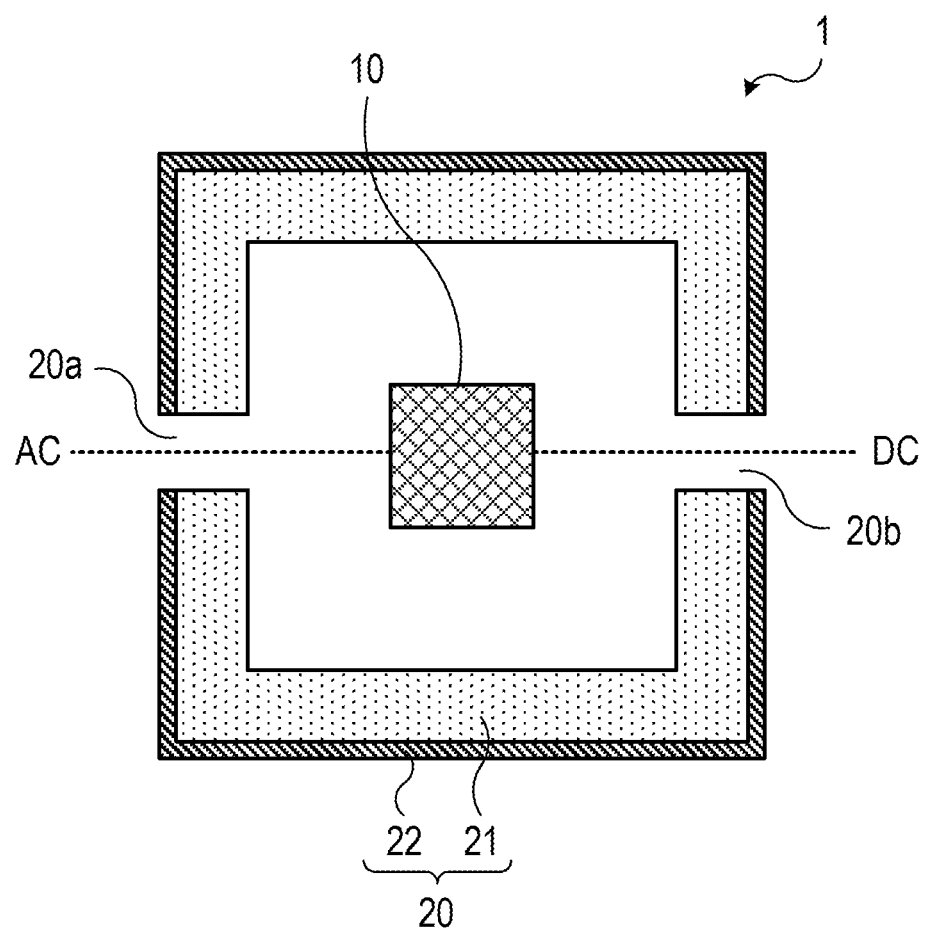
FIG. 3 is a view illustrating a first example of the electronic device according to the first embodiment.

FIG. 3 is a view illustrating a first example of the electronic device according to the first embodiment. FIG. 3 schematically illustrates a sectional view of the main part of the electronic device. In the electronic device 1 as described above, the layer 20 enclosing the electromagnetic wave radiator 10 is not necessarily required to have the sealed structure.

For example, when the electronic device 1 is a power supply device such as an AC adapter, openings 20a and 20b may be formed in the layer 20 enclosing the electromagnetic wave radiator 10 as illustrated in FIG. 3. In this case, alternating current (AC) power is input to a circuit included in the electromagnetic wave radiator 10 inside the electronic device 1 through one opening 20a, and direct current (DC) power is output from a circuit included in the electromagnetic wave radiator 10 through the other opening 20b.

In addition, the layer 20 is not limited to the example of FIG. 3 and may be provided with openings in various forms (including, for example, shapes and the number of openings). In addition, while FIG. 3 illustrates an example where the openings are formed in the layer 20 having the configuration illustrated in FIG. 2A, the openings may also be provided in the layer 20 having the configuration illustrated in each of FIGS. 2B and 2C.

Figure 4:
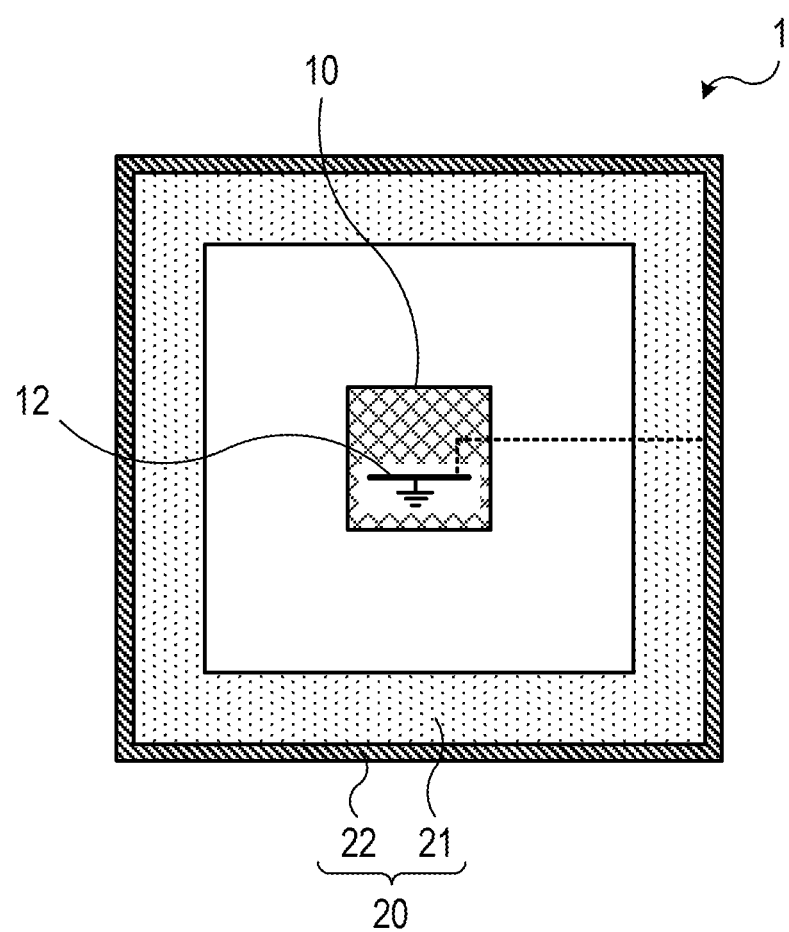
FIG. 4 is a view illustrating a second example of the electronic device according to the first embodiment.

FIG. 4 is a view illustrating a second example of the electronic device according to the first embodiment. FIG. 4 schematically illustrates a sectional view of the main part of the electronic device. The metal film 22 included in the layer 20 enclosing the electromagnetic wave radiator 10 in the electronic device 1 may be grounded.

For example, as illustrated in FIG. 4, the metal film 22 is coupled to a ground (GND) line 12 of a circuit included in the electromagnetic wave radiator 10 (indicated by a dashed line in FIG. 4). The connection of the metal film 22 to the GND line 12 may be performed by various electrical connection methods such as a via, a wire, and a lead.

When the electromagnetic waves are incident and currents flow through the metal film 22 in the case where the metal film 22 is coupled to the GND line 12 as described above, the currents are converted into thermal energy, and furthermore, the currents flow through the GND line 12, so that the efficiency of the absorption of the electromagnetic waves by the metal film 22 increases. Thus, the radiation of the electromagnetic waves to the outside of the electronic device 1 is suppressed, and as a result, the malfunction of, for example, peripheral electronic equipment and the malfunction of the electromagnetic wave radiator 10 enclosed by the layer 20 are effectively suppressed.

In addition, while FIG. 4 illustrates an example where the metal film 22 is coupled to the GND line 12 of the electromagnetic wave radiator 10, the metal film 22 may be grounded to any portion other than the GND line 12.

In addition, while FIG. 4 illustrates an example where the metal film 22 of the layer 20 having the configuration illustrated in FIG. 2A is grounded, the metal film 22 of the layer 20 having the configuration illustrated in each of FIGS. 2B and 2C may also be grounded.

Figure 5A:
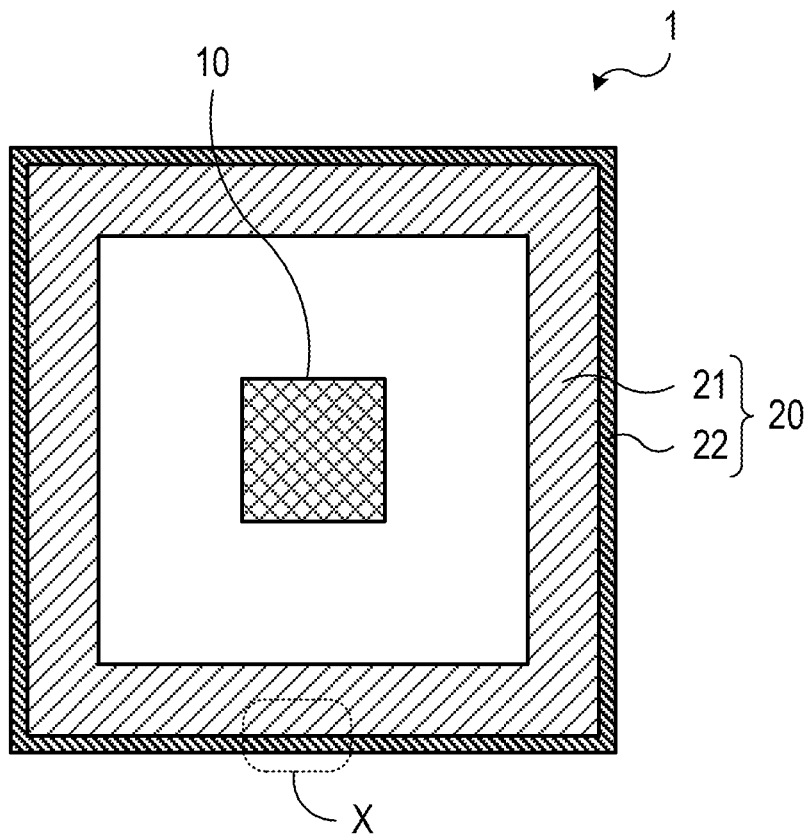
FIGS. 5A and 5B are views illustrating a third example of the electronic device according to the first embodiment.
Figure 5B:
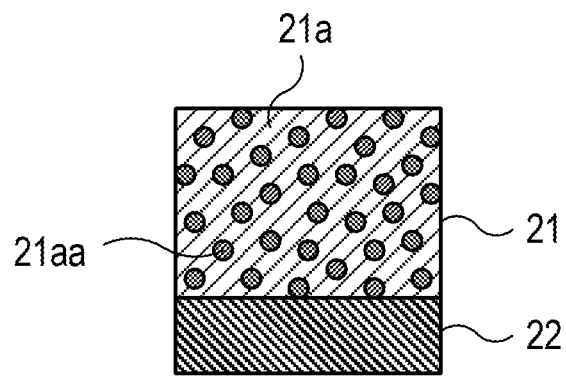

FIGS. 5A and 5B are views illustrating a third example of the electronic device according to the first embodiment. FIG. 5A schematically illustrates a sectional view of the main part of the electronic device. FIG. 5B schematically illustrates an example of a configuration of the portion X in FIG. 5A.

For example, as illustrated in FIG. 5B, a resin material 21a containing a filler 21aa may be used for the first enclosing layer 21 included in the layer 20 enclosing the electromagnetic wave radiator 10 of the electronic device 1.

As for the filler 21aa, various insulating or conductive fillers are used. For example, a type and a content of the filler 21aa are adjusted based on, for example, a mechanical characteristic, an electrical characteristic, and a magnetic characteristic which are required for the first enclosing layer 21.

For example, a carbon material is used for the filler 21aa. For example, carbon particles such as carbon black or a linear or coiled carbon fiber is used for the carbon material of the filler 21aa. When the carbon material is used for the filler 21aa, the electromagnetic waves radiated from the electromagnetic wave radiator 10 and irradiated to the carbon material are converted into thermal energy, so that the first enclosing layer 21 may have the function to absorb the electromagnetic waves. By selecting, for example, a content of the carbon material, a particle size of a carbon particle which is the carbon material, and a shape or a fiber diameter of the carbon fiber, the efficiency of the absorption of the electromagnetic waves by the first enclosing layer 21 may be adjusted.

Here, FIG. 5B illustrates an example where the resin material 21a containing the filler 21aa is used for the first enclosing layer 21 of the layer 20 having the configuration illustrated in FIG. 2A. In addition, the resin material 21a containing the filler 21aa may also be used for the layer 20 having the configuration illustrated in each of FIGS. 2B and 2C.

Figure 6A:
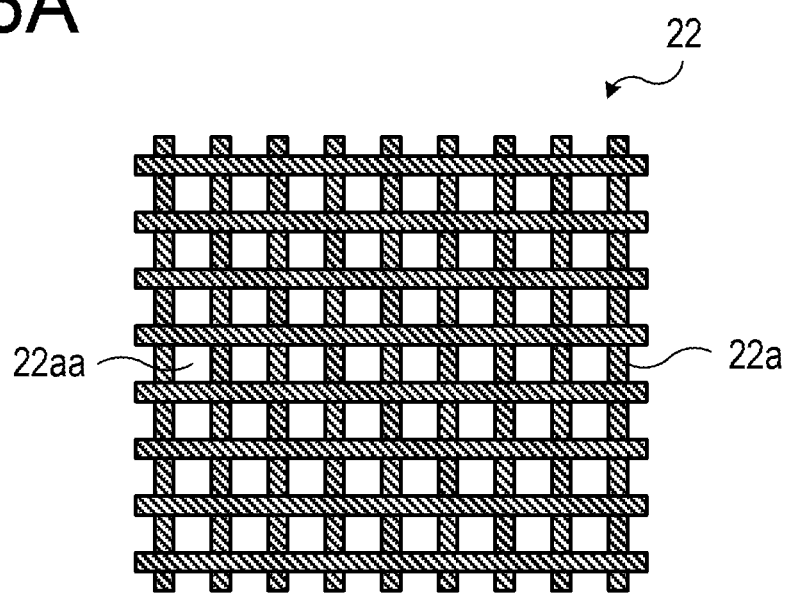
FIGS. 6A and 6B are views illustrating a fourth example of the electronic device according to the first embodiment.
Figure 6B:
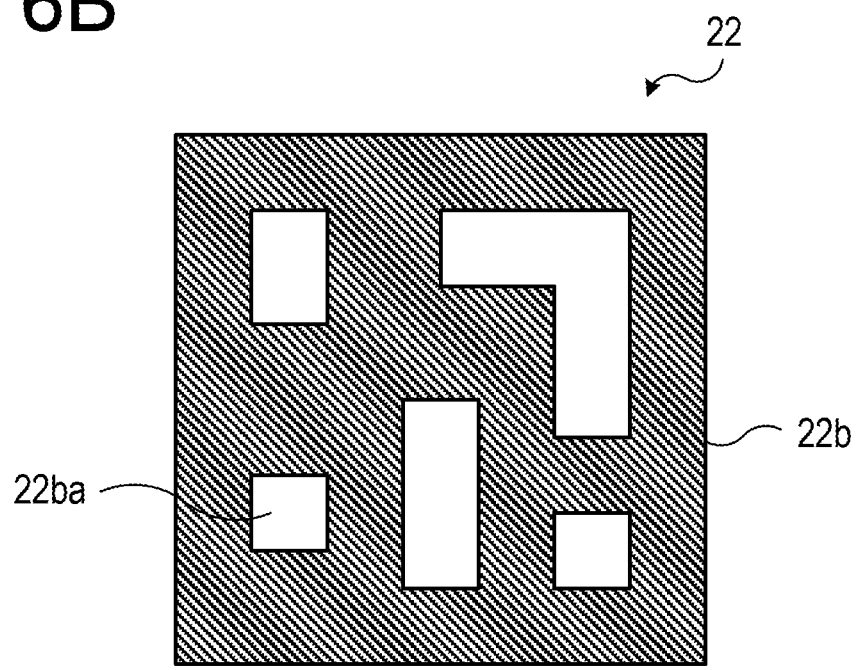

FIGS. 6A and 6B are views illustrating a fourth example of the electronic device according to the first embodiment. Each of FIGS. 6A and 6B schematically illustrates a plan view of the main part of the metal film used for the electronic device.

The metal film 22 included in the layer 20 enclosing the electromagnetic wave radiator 10 of the electronic device 1 may have various patterns. For example, as illustrated in FIG. 6A, the metal film 22 is formed in a mesh pattern 22a having a group of vertically and horizontally arranged openings 22aa. When the metal film 22 is formed in the mesh pattern 22a as described above, the resistance of the metal film 22 increases, as compared with a case where the metal film 22 is formed in a planar shape (so-called a solid film shape) on the surface of the first enclosing layer 21. When the resistance of the metal film 22 increases, it is possible to improve the efficiency of the conversion of the currents flowing through the metal film 22 due to the incidence of the electromagnetic waves into thermal energy. Thus, the efficiency of the absorption of the electromagnetic waves by the metal film 22 may be improved, and the radiation of the electromagnetic waves to the outside of the electronic device 1 is suppressed, and as a result, the malfunction of, for example, peripheral electronic equipment and the malfunction of the electromagnetic wave radiator 10 enclosed by the layer 20 are effectively suppressed.

In addition, as illustrated in FIG. 6B, the metal film 22 may be formed in an antenna pattern 22b in which openings 22ba are formed, as used for a planar antenna. For example, the metal film 22 is formed in the antenna pattern 22b in which the openings 22ba are formed to be able to cope with a plurality of frequency components of the electromagnetic waves radiated from the electromagnetic wave radiator 10. In the antenna pattern 22b as well, the resistance of the metal film 22 increases, as compared with a case where the metal film 22 is formed in the planar shape on the surface of the first enclosing layer 21, so that the efficiency of the conversion of the incident electromagnetic waves into thermal energy may be improved. As a result, the radiation of the electromagnetic waves to the outside of the electronic device 1 is suppressed, and as a result, the malfunction of, for example, peripheral electronic equipment and the malfunction of the electromagnetic wave radiator 10 are effectively suppressed. In addition, in the antenna pattern 22b, a plurality of current paths is provided by the openings 22ba so that the plurality of frequency components of the electromagnetic waves may be absorbed by the metal film 22.

Figure 7A:
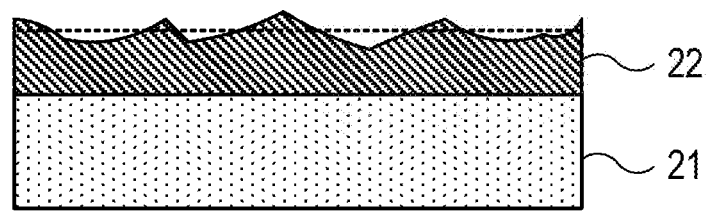
FIGS. 7A to 7C are views illustrating a fifth example of the electronic device according to the first embodiment.
Figure 7B:
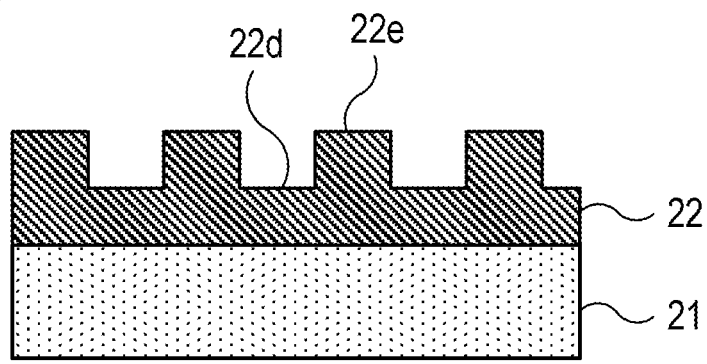
Figure 7C:
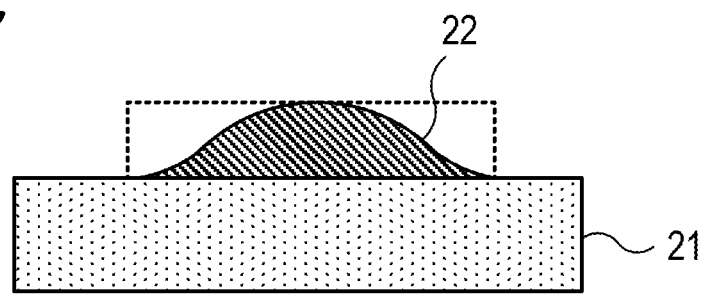

In addition, the metal film 22 having various patterns such as the mesh pattern 22a may be used for the layer 20 having the configuration illustrated in each of FIGS. 2A to 2C. FIGS. 7A to 7C are views illustrating a fifth example of the electronic device according to the first embodiment. Each of FIGS. 7A to 7C schematically illustrates a sectional view of the main part of the layer used for the electronic device.

Each of FIGS. 7A to 7C illustrates an example of the first enclosing layer 21 and the metal film 22 formed on the surface of the first enclosing layer 21, in the layer 20 used for the electronic device 1. As illustrated in FIG. 7A, when the metal film 22 on the surface of the first enclosing layer 21 has a surface roughness, the resistance of the metal film 22 increases, as compared with a case where the metal film 22 is flat (indicated by a dashed line in FIG. 7A). When the resistance increases by adjusting the surface roughness of the metal film 22, the efficiency of the conversion of the incident electromagnetic waves into thermal energy may be improved. As a result, the efficiency of the absorption of the electromagnetic waves by the metal film 22 may be improved, and the radiation of the electromagnetic waves to the outside of the electronic device 1 is suppressed, and as a result, the malfunction of, for example, peripheral electronic equipment and the malfunction of the electromagnetic wave radiator 10 enclosed by the layer 20 are effectively suppressed.

In addition, as illustrated in FIG. 7B, the metal film 22 on the first enclosing layer 21 may be formed in an uneven shape having a concave portion 22d and a convex portion 22e. The convex portion 22e may have various shapes such as an island shape, a column shape, and a plate shape. The resistance of the metal film 22 increases by forming the metal film 22 having the uneven shape described above. Thus, the efficiency of the conversion of the incident electromagnetic waves into thermal energy may be improved, and the efficiency of the absorption of the electromagnetic waves may be improved, so that the radiation of the electromagnetic waves to the outside of the electronic device 1 is suppressed, and as a result, the malfunction of, for example, peripheral electronic equipment and the malfunction of the electromagnetic wave radiator 10 enclosed by the layer 20 are suppressed. Further, since the metal film 22 is formed in the uneven shape, the surface area of the metal film 22 increases. As a result, the performance of discharging (dissipating) the thermal energy converted from the incident electromagnetic waves to the outside may be improved, and the efficiency of the absorption of the electromagnetic waves may be improved.

In addition, as illustrated in FIG. 7C, the metal film 22 on the first enclosing layer 21 may have a gentle sloping shape. When the metal film 22 has the gentle sloping shape, the resistance thereof increases, as compared with a case where the metal film 22 is formed in an angular shape (indicated by a dashed line in FIG. 7C). In the metal film 22 having the angular shape, flowing currents relatively concentrate on the respective angular portions. Thus, when the metal film 22 is formed in the gentle sloping shape, no angular portions exist, and thus, currents hardly flow. As a result, the resistance of the metal film 22 increases. When the metal film 22 is formed in the gentle sloping shape, and thus, the resistance thereof increases, the efficiency of the conversion of the incident electromagnetic waves into thermal energy may be improved. Thus, the efficiency of the absorption of the electromagnetic waves by the metal film 22 may be improved. As a result, the radiation of the electromagnetic waves to the outside of the electronic device 1 is suppressed, and as a result, the malfunction of, for example, peripheral electronic equipment and the malfunction of the electromagnetic wave radiator 10 enclosed by the layer 20 are effectively suppressed.

In addition, the metal film 22 having the surface roughness or the uneven shape as described above or the metal film 22 having the gentle sloping shape may also be used for the layer 20 having the configuration illustrated in each of FIGS. 2A to 2C.

Figure 8A:
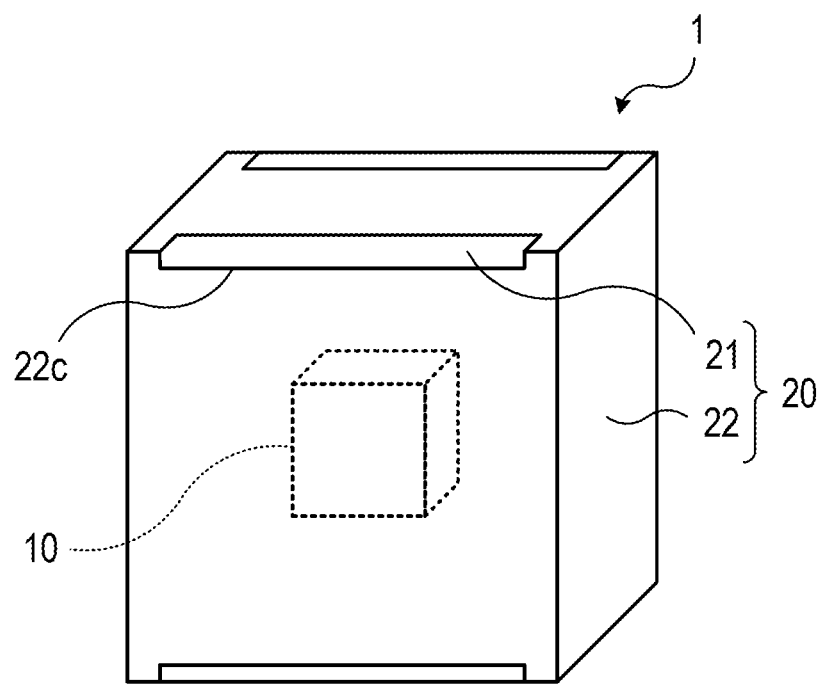
FIGS. 8A and 8B are views illustrating a sixth example of the electronic device according to the first embodiment.
Figure 8B:
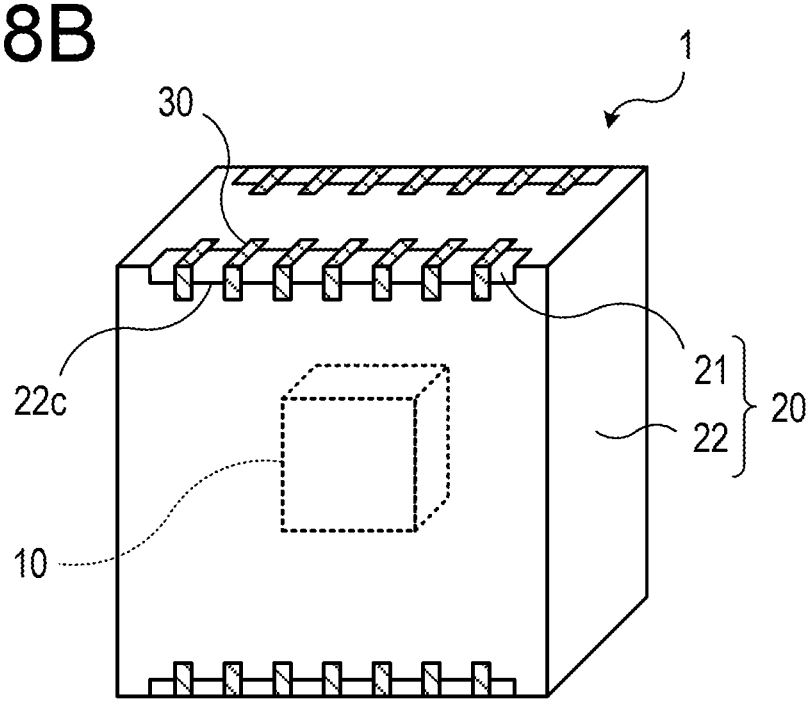

FIGS. 8A and 8B are views illustrating a sixth example of the electronic device according to the first embodiment. Each of FIGS. 8A and 8B schematically illustrates a sectional view of the main part of the electronic device. As illustrated in FIG. 8A, a slit 22c may be formed as an opening in the metal film 22 formed on the surface of the first enclosing layer 21 of the layer 20 enclosing the electromagnetic wave radiator 10 of the electronic device 1. FIG. 8A illustrates an example where the slit 22c is formed in the peripheral edge portion of the box-shaped layer 20. In the case where the slit 22c is formed in the metal film 22, the resistance of the metal film 22 also increases, and thus, the efficiency of the conversion of the incident electromagnetic waves into thermal energy may be improved. As a result, the radiation of the electromagnetic waves to the outside of the electronic device 1 is suppressed, and as a result, the malfunction of, for example, peripheral electronic equipment and the malfunction of the electromagnetic wave radiator 10 are effectively suppressed.

In addition, as illustrated in FIG. 8B, resistance elements 30 (electronic circuits) may be provided over the slit 22c formed in the metal film 22 to bridge the portions of the metal film 22 between which the slit 22c is formed. Each resistance element 30 may be formed of, for example, a metal film, a metal wire, or a metal block using a material with a higher resistivity than that of the material of the metal film 22. For example, aluminum may be used for the metal film 22, and nickel-chromium alloy may be used for the resistive element 30. In addition, the resistance element 30 may be formed of, for example, a metal film, a metal wire, or a metal block which is the same material as that of the metal film 22 but has a thicker film thickness than that of the metal film 22.

Depending on the material used for the metal film 22, the resistance of the material may be basically low or it may not be possible to obtain a sufficient resistance enough to absorb the incident electromagnetic waves by converting the electromagnetic waves to thermal energy even though, for example, the process of forming an opening is performed. In this case as well, when the resistance elements 30 having the higher resistance than that of the metal film 22 are coupled (mounted) to the metal film 22 as illustrated in FIG. 8B, the currents flowing by the incidence of the electromagnetic waves on the metal film 22 are converted into thermal energy by the resistance elements 30, in addition to the metal film 22, so that the electromagnetic waves may be absorbed.

Here, each of FIGS. 8A and 8B illustrates an example where the slit 22c or the resistance elements 30 are provided in the layer 20 having the configuration illustrated in FIG. 2A. In addition, the slit 22c or the resistance elements 30 may also be provided in the layer 20 having the configuration illustrated in each of FIGS. 2B and 2C.

Figure 9A:
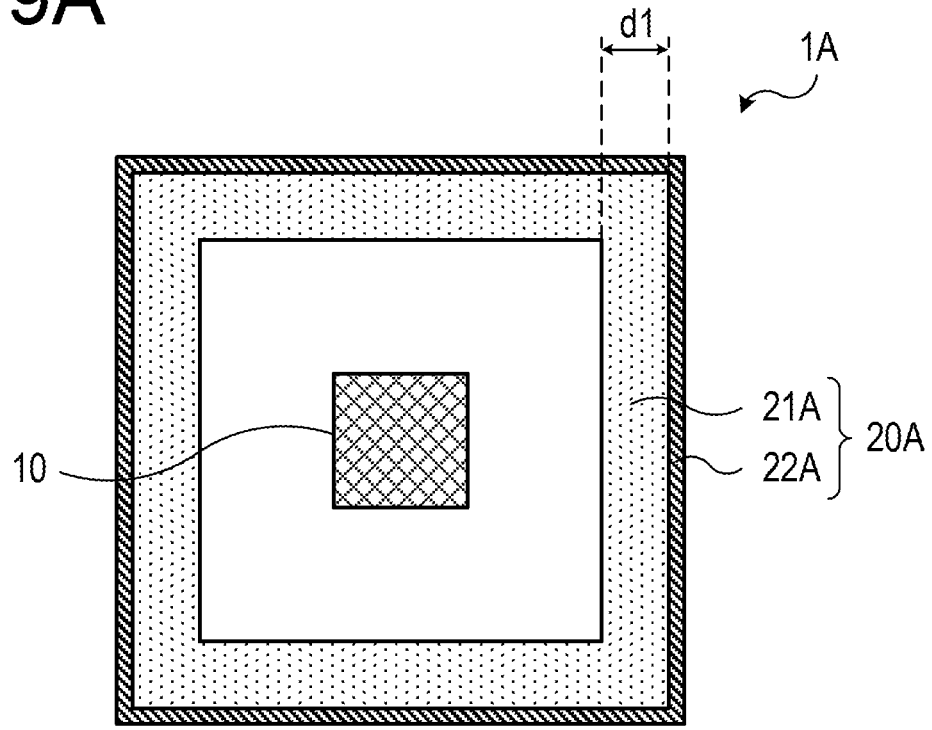
FIGS. 9A and 9B are views illustrating an example of a configuration of an electronic device according to a second embodiment.
Figure 9B:
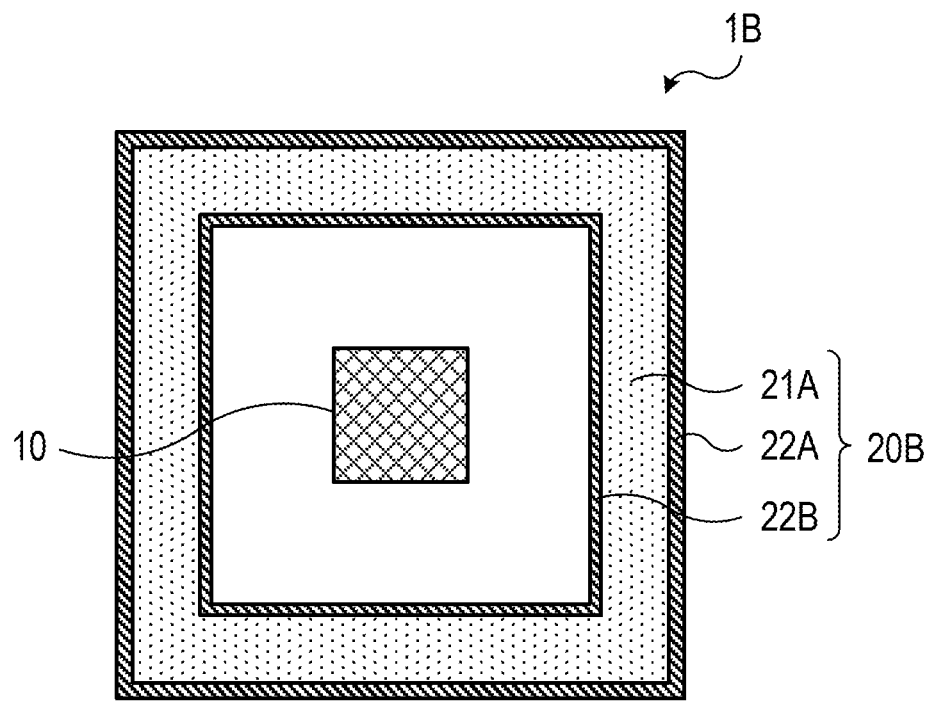

Next, a second embodiment will be described. FIGS. 9A and 9B are views illustrating examples of a configuration of an electronic device according to the second embodiment. Each of FIGS. 9A and 9B schematically illustrates a sectional view of the main part of the electronic device.

As illustrated in FIG. 9A, an electronic device 1A includes the electromagnetic wave radiator 10 and a layer 20A formed to enclose the electromagnetic wave radiator 10. The layer 20A is an example of an electromagnetic wave absorber that absorbs the electromagnetic waves radiated from the electromagnetic wave radiator 10, and includes a first enclosing layer 21A that encloses the electromagnetic wave radiator 10, and a metal film 22A formed on the surface of the first enclosing layer 21A.

As for the first enclosing layer 21A, various insulating materials such as, for example, resin materials such as ABS resin or epoxy resin, are used. As for the metal film 22, various metal materials such as, for example, metal materials such as aluminum or alloy materials such as nickel chromium are used. The metal film 22A may have various pattern shapes by, for example, forming an opening.

In the electronic device 1A, the thickness d1 of the first enclosing layer 21A of the layer 20A is set to (2m−1)/4 times (m is a natural number) the wavelength of the electromagnetic waves radiated from the electromagnetic wave radiator 10 and propagating inside the first enclosing layer 21A.

Assuming that the wavelength of the electromagnetic waves radiated from the electromagnetic wave radiator 10 is λo and the relative dielectric constant of the first enclosing layer 21A is εr, the wavelength λs of the electromagnetic waves propagating inside the first enclosing layer 21A is represented by the following equation (1).

$$\lambda s = \lambda o / \sqrt{\varepsilon r} \tag{1}$$

Thus, the thickness d1 of the first enclosing layer 21A to be set is represented by the following equation (2).

$$d1 = (2m-1)\lambda s/4 = (2m-1)\lambda o/4\sqrt{\varepsilon r} \tag{2}$$

When the thickness d1 of the first enclosing layer 21A is set to the value of the Equation (2) above, the layer 20A may be caused to function as a so-called λ/4 type electromagnetic wave absorber.

That is, the electromagnetic waves which are incident and are reflected on the surface of the first enclosing layer 21A of the layer 20A and the electromagnetic waves which propagate through the first enclosing layer 21A having the thickness d1 to reach and be reflected on the metal film 22 are interfered so that the electromagnetic waves from the layer 20A may be offset or eliminated, or the amplitude of the waves reflected from the layer 20A is attenuated. As a result, the radiation of the electromagnetic waves to the outside of the electronic device 1A is suppressed, and as a result, the malfunction of, for example, peripheral electronic equipment and the malfunction of the electromagnetic wave radiator 10 are suppressed.

In addition, as illustrated in FIG. 9B, an electronic device 1B includes a layer 20B formed to enclose the electromagnetic wave radiator 10. The layer 20B is an example of an electromagnetic wave absorber, and includes the first enclosing layer 21A that encloses the electromagnetic wave radiator 10, the metal film 22A formed on the surface of the first enclosing layer 21A, and a metal film 22B formed on the surface of the first enclosing layer 21A which is opposite to the side of the metal film 22B.

That is, the electronic device 1B has a structure in which the metal film 22B is further formed on the inner side of the first enclosing layer 21A in the layer 20A of the electronic device 1A. As for the metal film 22B, various metal materials such as, for example, metal materials such as aluminum or alloy materials such as nickel chromium, are used. The metal film 22B may have various pattern shapes by, for example, forming an opening.

In the electronic device 1B, the effect of absorbing the electromagnetic waves by the metal film 22B is obtained, and furthermore, even when there exists a frequency component of the electromagnetic waves which passes through the metal film 22B, the component of the electromagnetic waves may be absorbed by the metal film 22A. At that time, when the thickness (the thickness d1 described above) of the first enclosing layer 21A is appropriately set based on the wavelength of the component of the electromagnetic waves which passes through the metal film 22B, a high effect in absorbing the component may be obtained. Thus, the radiation of the electromagnetic waves to the outside of the electronic device 1B is suppressed, and as a result, the malfunction of, for example, peripheral electronic equipment and the malfunction of the electromagnetic wave radiator 10 are suppressed.

The first enclosing layer 21A of each of the electronic devices 1A and 1B may contain various fillers as described above in the first embodiment (FIGS. 5A and 5B). When the first enclosing layer 21A contains a filler, the number of the places where the propagation of the electromagnetic waves changes may be increased, or when the first enclosing layer 21A contains a filler made of a carbon material, the efficiency of the absorption of the electromagnetic waves may be improved.

In the electronic devices 1A and 1B, the layers 20A and 20B may be used as a housing for accommodating the electromagnetic wave radiator 10. Next, a third embodiment will be described.

Figure 10:
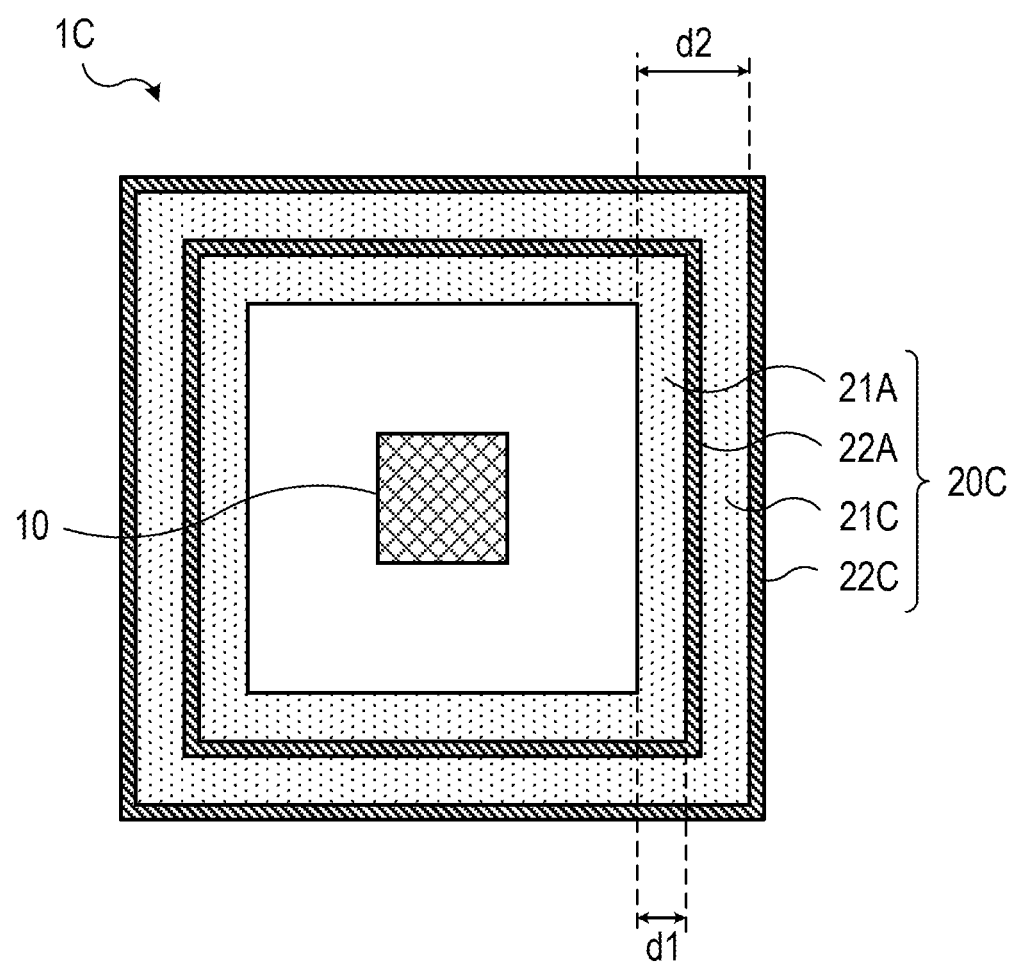
FIG. 10 is a view illustrating an example of a configuration of an electronic device according to a third embodiment.

FIG. 10 is a view illustrating an example of a configuration of an electronic device according to the third embodiment. FIG. 10 schematically illustrates a sectional view of the main part of the electronic device. As illustrated in FIG. 10, an electronic device 1C includes the electromagnetic wave radiator 10 and a layer 20C formed to enclose the electromagnetic wave radiator 10. The layer 20C is an example of an electromagnetic wave absorber, and includes the first enclosing layer 21A that encloses the electromagnetic wave radiator 10, the metal film 22A formed on the surface of the first enclosing layer 21A, a third enclosing layer 21C, and a metal film 22C formed on the surface of the third enclosing layer 21C.

As for the third enclosing layer 21C, various insulating materials such as, for example, resin materials such as ABS resin and epoxy resin, are used, as used for the first enclosing layer 21A. The enclosing layers 21A and 21C may contain various fillers such as a carbon material. As for the metal film 22C, various metal materials such as, for example, metal materials such as aluminum or alloy materials such as nickel chromium are used, as used for the metal film 22A. The metal films 22A and 22C may have various pattern shapes by, for example, forming an opening. The third enclosing layer 21C is formed to cover the metal film 22A on the surface of the first enclosing layer 21A.

In the layer 20C, the thickness d1 of the first enclosing layer 21A is set to $(2m-1)/4$ times (m is a natural number) the wavelength of a relatively high frequency component of the electromagnetic waves radiated from the electromagnetic wave radiator 10 and propagating inside the first enclosing layer 21A. Further, in the layer 20C, the total thickness d2 of the enclosing layers 21A and 21C is set to $(2m-1)/4$ times (m is a natural number) the wavelength of a relatively low frequency component of the electromagnetic waves radiated from the electromagnetic wave radiator 10 and propagating inside the enclosing layers 21A and 21C. The metal films 22A and 22C are formed at the positions where the thicknesses of the enclosing layers 21A and 21C described above are met.

That is, in the layer 20C, a first $\lambda/4$ type electromagnetic wave absorber is formed by the enclosing layers 21A and 21C and the metal film 22C, and a second $\lambda/4$ type electromagnetic wave absorber is formed by the first enclosing layer 21A and the metal film 22A.

In the electronic device 1C, the relatively low frequency component of the electromagnetic waves propagating inside the enclosing layers 21A and 21C is absorbed by the $\lambda/4$ type electromagnetic wave absorber formed by the enclosing layers 21A and 21C and the metal film 22C. Further, in the electronic device 1C, the relatively high frequency component of the electromagnetic waves propagating inside the first enclosing layer 21A, that is, harmonics are absorbed by the $\lambda/4$ type electromagnetic wave absorber formed by the first enclosing layer 21A and the metal film 22A.

As described above, in the electronic device 1C, the plurality of frequency components included in the electromagnetic waves radiated from the electromagnetic wave radiator 10 may be absorbed by the layer 20C. Thus, the radiation of the electromagnetic waves to the outside of the electronic device 1C is suppressed, and as a result, the malfunction of, for example, peripheral electronic equipment and the malfunction of the electromagnetic wave radiator 10 are effectively suppressed.

In addition, in the electronic device 1C, the layer 20C may be used as a housing for accommodating the electromagnetic wave radiator 10. Next, a fourth embodiment will be described.

Figure 11:
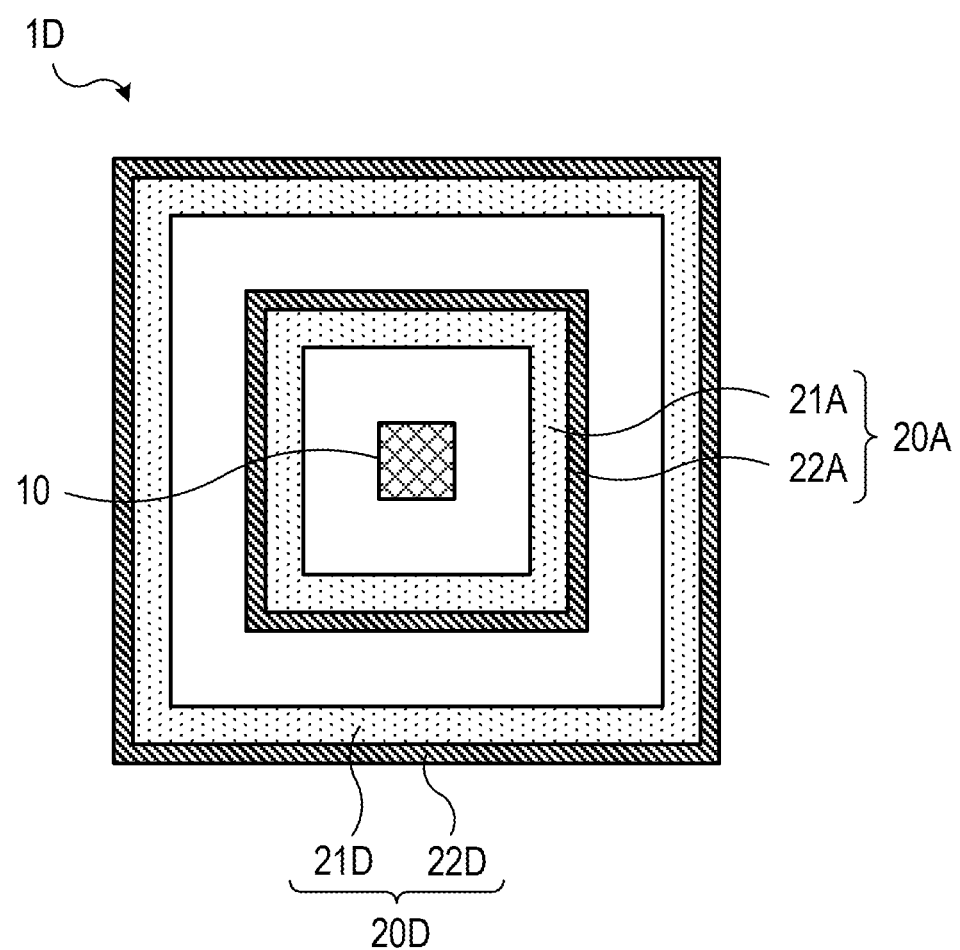
FIG. 11 is a view illustrating an example of a configuration of an electronic device according to a fourth embodiment.

FIG. 11 is a view illustrating an example of a configuration of an electronic device according to the first embodiment. FIG. 11 schematically illustrates a sectional view of the main part of the electronic device. As illustrated in FIG. 11, an electronic device 1D includes the electromagnetic wave radiator 10, the layer 20A formed to enclose the electromagnetic wave radiator 10, and a layer 20D formed to enclose the layer 20A while being spaced apart from the layer 20A. The layers 20A and 20D are examples of an electromagnetic wave absorber. The inner layer 20A includes the first enclosing layer 21A that encloses the electromagnetic wave radiator 10, and the metal film 22A formed on the surface of the first enclosing layer 21A. The outer layer 20D includes a third enclosing layer 21D that encloses the electromagnetic wave radiator 10 and the inner layer 20A, and a metal film 22D formed on the surface of the third enclosing layer 21D.

As for the third enclosing layer 21D, various insulating materials such as, for example, resin materials such as ABS resin and epoxy resin are used, as used for the first enclosing layer 21A. The enclosing layers 21A and 21D may contain various fillers such as a carbon material. As for the metal film 22D, various metal materials such as, for example, metal materials such as aluminum or alloy materials such as nickel chromium are used, as used for the metal film 22A. The metal films 22A and 22D may have various pattern shapes by, for example, forming an opening.

In the electronic device 1D, the relatively high frequency component of the electromagnetic waves propagating inside the first enclosing layer 21A, that is, harmonics are absorbed by the inner layer 20A including the first enclosing layer 21A and the metal film 22A. Further, in the electronic device 1D, the relatively low frequency component of the electromagnetic waves passing through the first enclosing layer 21A and the metal film 22A and propagating inside the first enclosing layer 21D are absorbed by the outer layer 20D including the first enclosing layer 21D and the metal film 22C.

As described above, in the electronic device 1D, the plurality of frequency components included in the electromagnetic waves radiated from the electromagnetic wave radiator 10 may be absorbed by the inner layer 20A and the outer layer 20D. Thus, the radiation of the electromagnetic waves to the outside of the electronic device 1D is suppressed, and as a result, the malfunction of, for example, peripheral electronic equipment and the malfunction of the electromagnetic wave radiator 10 are effectively suppressed.

In the electronic device 1D, the thickness of the first enclosing layer 21A formed in the inner layer 20A is set to $(2m-1)/4$ times (m is a natural number) the wavelength of the relatively high frequency component of the electromagnetic waves radiated from the electromagnetic wave radiator 10 and propagating inside the first enclosing layer 21A. Further, the thickness of the third enclosing layer 21D formed in the outer layer 20D is set to $(2m-1)/4$ times (m is a natural number) the wavelength of the relatively low frequency component of the electromagnetic waves radiated from the electromagnetic wave radiator 10 and propagating inside the third enclosing layer 21D. By setting the thickness of each of the enclosing layers 21A and 21D to the value described above, the layers 20A and 20D may be caused to function as a $\lambda/4$ type electromagnetic wave absorber.

In addition, in the electronic device 1D, the layer 20A or 20D, or the layers 20A and 20D may be used as a housing for accommodating the electromagnetic wave radiator 10.

Next, a fifth embodiment will be described.

Figure 12A:
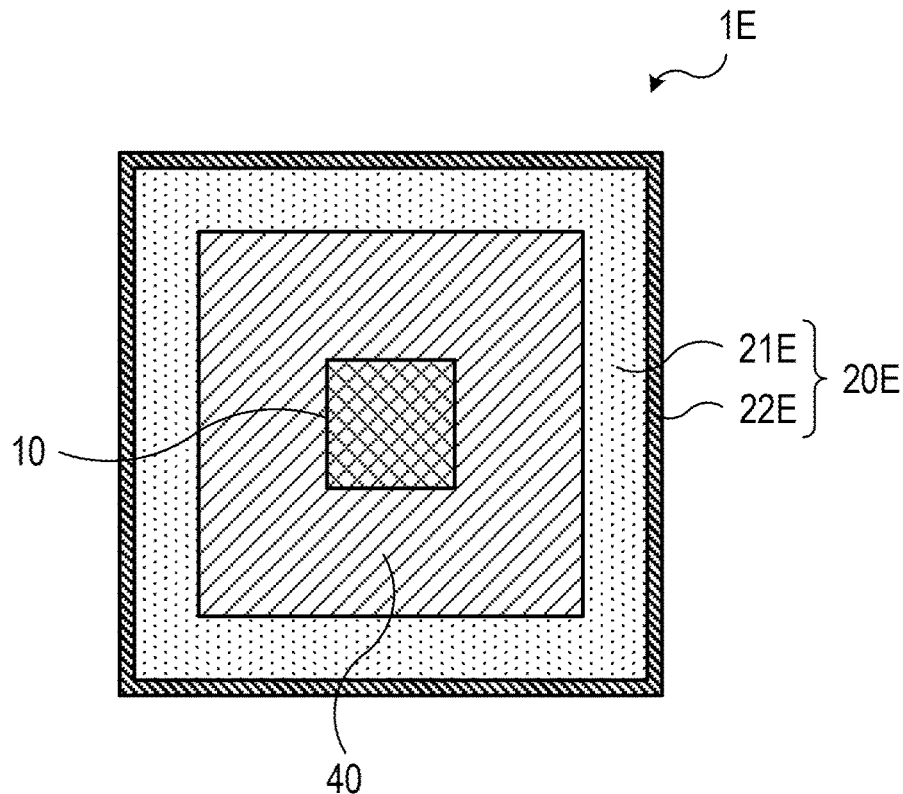
FIGS. 12A and 12B are views illustrating an example of a configuration of an electronic device according to a fifth embodiment.
Figure 12B:
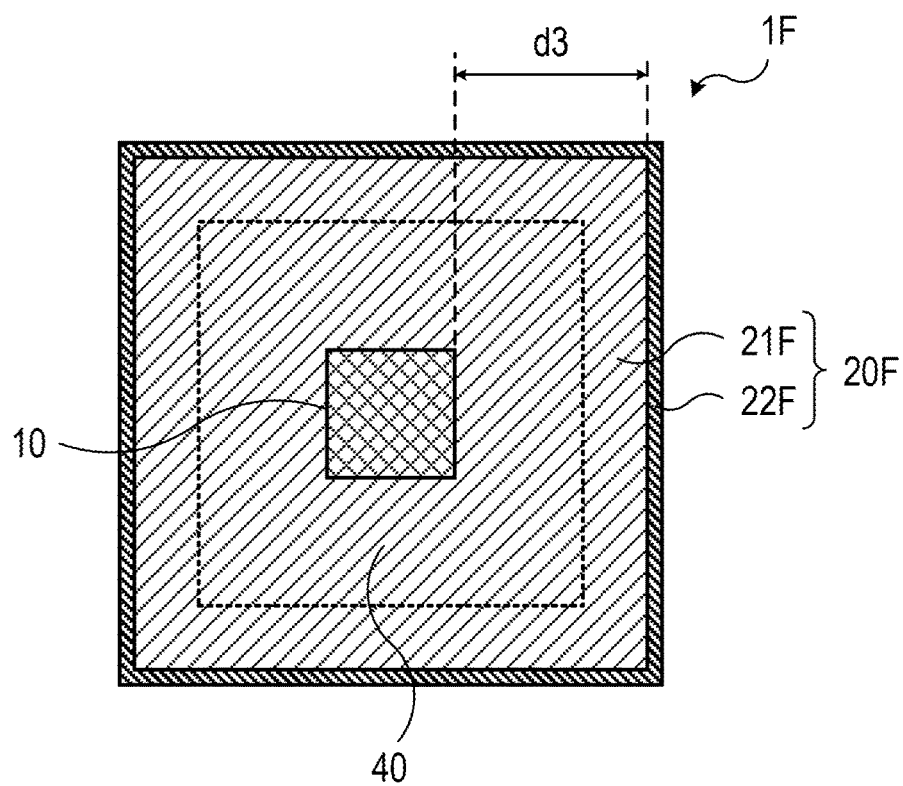

FIGS. 12A and 12B are views illustrating an example of a configuration of an electronic device according to the fifth embodiment. Each of FIGS. 12A and 12B schematically illustrates a sectional view of the main part of the electronic device. As illustrated in FIG. 12A, an electronic device 1E includes the electromagnetic wave radiator 10, a layer 20E formed to enclose the electromagnetic wave radiator 10, and a filling layer 40 filled between the electromagnetic wave radiator 10 and the layer 20E. The layer 20E is an example of an electromagnetic wave absorber, and includes a first enclosing layer 21E and a metal film 22E formed on the surface of the first enclosing layer 21E.

As for the first enclosing layer 21E, various insulating materials such as, for example, resin materials such as ABS resin and epoxy resin are used. As for the metal film 22E, various metal materials such as, for example, metal materials such as aluminum or alloy materials such as nickel chromium are used. The metal film 22E may have various pattern shapes by, for example, forming an opening. The thickness of the first enclosing layer 21E may be set to $(2m-1)/4$ times (m is a natural number) the wavelength of the electromagnetic waves radiated from the electromagnetic wave radiator 10 and propagating inside the first enclosing layer 21E. Thus, the layer 20E may be caused to function as a $\lambda/4$ type electromagnetic wave absorber.

As for the filling layer 40, various insulating materials such as, for example, resin materials such as epoxy resin are used. The filling layer 40 may contain various fillers such as a carbon material. For example, when the filling layer 40 contains a carbon material as a filler, the efficiency of the absorption of the electromagnetic waves radiated from the electromagnetic wave radiator 10 may be improved.

In addition, as illustrated in FIG. 12B, an electronic device 1F includes a layer 20F provided to enclose the electromagnetic wave radiator 10 and the filling layer 40 filled between the electromagnetic wave radiator 10 and the layer 20F. The layer 20F is an example of an electromagnetic wave absorber, and includes a first enclosing layer 21F and a metal film 22F formed on the surface of the first enclosing layer 21F. As for the metal film 22F, various metal materials such as, for example, metal materials such as aluminum or alloy materials such as nickel chromium are used. The metal film 22F may have various pattern shapes by, for example, forming an opening.

In the electronic device 1F, the same insulating material as that of the filling layer 40 is used for the first enclosing layer 21F of the layer 20F. The filling layer 40 and the first enclosing layer 21F may contain various fillers such as a carbon material, and for example, when a carbon material is contained, the efficiency of the absorption of the electromagnetic waves radiated from the electromagnetic wave radiator 10 may be improved. In addition, the filling layer 40 and the first enclosing layer 21F of the electronic device 1F may have an integrated single layer structure.

In the electronic device 1F, for example, the total thickness d3 of the filling layer 40 and the first enclosing layer 21F may be set to $(2m-1)/4$ times (m is a natural number) the wavelength of the electromagnetic waves radiated from the electromagnetic wave radiator 10 and propagating inside the filling layer 40 and the first enclosing layer 21A. Thus, the filing layer 40, the first enclosing layer 21F, and the metal film 22F may be caused to function as a $\lambda/4$ type electromagnetic wave absorber.

As in the electronic devices 1E and 1F, the filling layer 40 may be filled between the electromagnetic wave radiator 10 and the layer 20E and between the electromagnetic wave radiator 10 and the layer 20F. Here, in the electronic device 1E, the layer 20E, or the filling layer 40 and the layer 20E (the first enclosing layer 21E and the metal film 22E) become the enclosing layer that encloses the electromagnetic wave radiator 10. In addition, in the electronic device 1E, the layer 20E, or the filling layer 40 and the layer 20E may be used as a housing for housing the electromagnetic wave radiator 10.

In addition, in the electronic device 1F, the layer 20F, or the filling layer 40 and the layer 20F (the first enclosing layer 21F and the metal film 22F) become the enclosing layer that encloses the electromagnetic wave radiator 10. In addition, in the electronic device 1F, the layer 20F, or the filling layer 40 and the layer 20F may be used as a housing for accommodating the electromagnetic wave radiator 10.

In addition, the filling layer 40 may also be formed between the electromagnetic wave radiator 10 and the layer 20A and between the electromagnetic wave radiator 10 and the layer 20B which are described above in the second embodiment (FIGS. 9A and 9B). In addition, the filling layer 40 may also be formed between the electromagnetic wave radiator 10 and the layer 20C which is described above in the third embodiment (FIG. 10), or between the electromagnetic wave radiator 10 and the inner layer 20A and between the inner layer 20A and the outer layer 20D which are described above in the fourth embodiment (FIG. 11). In these cases, a λ/4 type electromagnetic wave absorber may be formed by appropriately adjusting the distance from the electromagnetic wave radiator 10 to the metal film 22, 22A, 22B, 22C, or 22D, including the filling layer 40.

Figure 13:
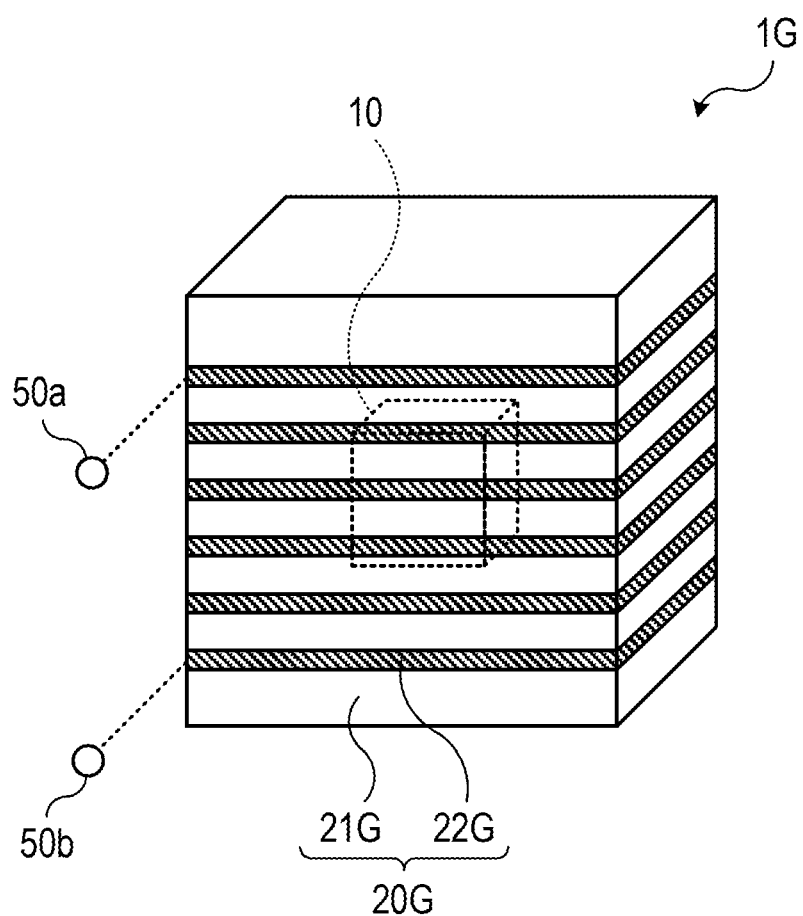
FIG. 13 is a view illustrating an example of a configuration of an electronic device according to a sixth embodiment.

Next, a sixth embodiment will be described. FIG. 13 is a view illustrating an example of a configuration of an electronic device according to the sixth embodiment. FIG. 13 schematically illustrates a sectional view of the main part of the electronic device.

As illustrated in FIG. 13, an electronic device 1G includes the electromagnetic wave radiator 10 and a layer 20G formed to enclose the electromagnetic wave radiator 10. The layer 20G is an example of an electromagnetic wave absorber, and includes a first enclosing layer 21G that encloses the electromagnetic wave radiator 10, and a metal film 22G formed on the surface of the first enclosing layer 21G and having a coiled pattern.

As for the first enclosing layer 21G, various insulating materials such as, for example, resin materials such as ABS resin or epoxy resin are used. The first enclosing layer 21G may contain various fillers such as a carbon material. The thickness of the first enclosing layer 21G may be set to (2m−1)/4 times (m is a natural number) the wavelength of the electromagnetic waves radiated from the electromagnetic wave radiator 10 and propagating inside the first enclosing layer 21G. Thus, the layer 20G may be caused to function as a λ/4 type electromagnetic wave absorber. As for the metal film 22G, various metal materials such as, for example, metal materials such as aluminum are used. The metal film 22G having the coiled pattern is formed on the surface of the first enclosing layer 21G to be wound around the electromagnetic wave radiator 10.

In the electronic device 1G, the electromagnetic waves radiated from the electromagnetic wave radiator 10 are absorbed by the layer 20G. Further, in the electronic device 1G, when the electromagnetic waves are radiated from the electromagnetic wave radiator 10 so that the magnetic field inside the layer 20G changes, the currents flow in the metal film 22G having the coiled pattern by the electromagnetic induction. In the electronic device 1G, the currents flowing in the metal film 22G by the absorption of the electromagnetic waves and the electromagnetic induction may be taken out to the outside by terminals 50a and 50b which are coupled to the metal film 22G.

In the layer 20G of the electronic device 1G, another metal film (not illustrated) may be further formed in the inner side of the metal film 22G (on the side of the electromagnetic wave radiator 10) having the coiled pattern via the first enclosing layer 21G. The electromagnetic waves radiated from the electromagnetic wave radiator 10 may be absorbed by the another metal film formed in the inner side. When a metal material having a relatively high magnetic permeability is used for the another metal film formed in the inner side, and the metal film is used as the core, the effect of the electromagnetic induction may be improved, and an amount of the currents to be taken out may be increased. For example, when aluminum is used for the metal film 22G and nickel is used for the another metal film formed in the inner side, the effect of the electromagnetic induction may be improved.

In addition, in the layer 20G of the electronic device 1G, another layer (not illustrated) including an enclosing layer and a metal film formed on the surface of the enclosing layer may be further formed outside the metal film 22G having the coiled pattern to enclose the layer 20G. By forming the another layer (an enclosing layer and a metal film) outside the layer 20G as described above, the electromagnetic waves from the electromagnetic wave radiator 10 may be absorbed by the another layer.

Figure 14A:
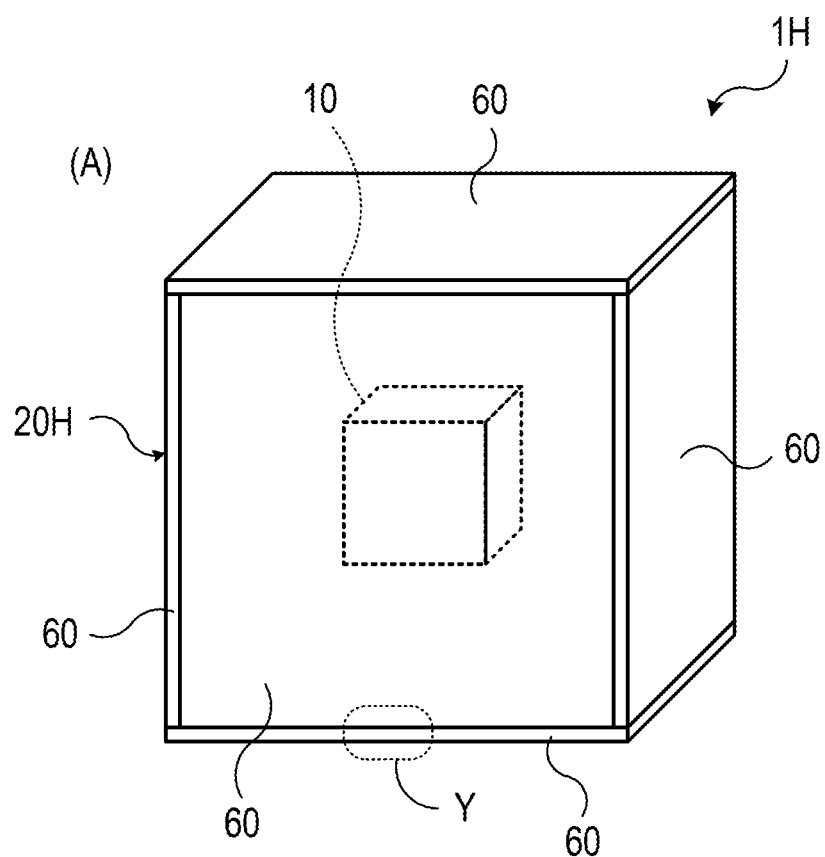
FIGS. 14A to 14D are views illustrating an example of a configuration of an electronic device according to a seventh embodiment.
Figure 14B:
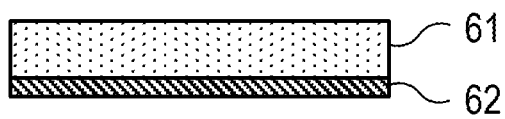
Figure 14C:
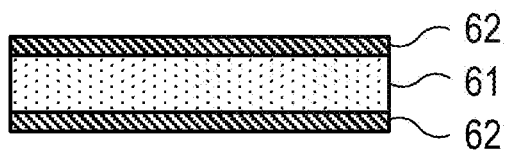
Figure 14D:
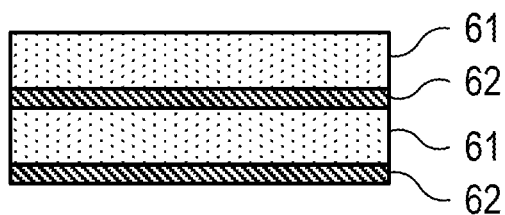

Next, a seventh embodiment will be described. FIGS. 14A to 14D are views illustrating an example of a configuration of an electronic device according to the seventh embodiment. FIG. 14A schematically illustrates a sectional view of the main part of the electronic device. Each of FIGS. 14B to 14D schematically illustrates an example of a configuration of the portion Y in FIG. 14A.

As illustrated in FIG. 14A, an electronic device 1H includes the electromagnetic wave radiator 10 and a layer 20H formed to enclose the electromagnetic wave radiator 10. The layer 20H is an example of an electromagnetic wave absorber, and has a box shaped structure of which respective surfaces (six surfaces) are formed by printed boards 60.

As illustrated in FIGS. 14B to 14D, each printed board 60 includes an insulating layer 61 and a metal film 62. For example, as illustrated in FIG. 14B, the printed board 60 includes the insulating layer 61 and the metal film 62 formed on one surface of the insulating layer 61 (which is opposite to the side of the electromagnetic wave radiator 10). In addition, as illustrated in FIG. 14C, the printed board 60 may include the insulating layer 61 and metal films 62 formed on both the surfaces of the insulating layer 61. In addition, as illustrated in FIG. 14D, the printed board 60 may have a structure in which a plurality of layers each obtained by forming the metal film 62 on one surface of the insulating layer 61 are laminated on each other.

As for the insulating layer 61, various insulating materials such as, for example, resin materials such as epoxy resin are used. The insulating layer 61 may contain various fillers such as a carbon material or a glass material. The thickness of the insulating layer 61 may be set to (2m−1)/4 times (m is a natural number) the wavelength of the electromagnetic waves radiated from the electromagnetic wave radiator 10 and propagating inside the insulating layer 61. As for the metal film 62, various metal materials such as, for example, metal materials such as aluminum or alloy materials such as nickel chromium may be used. The metal film 62 may have various pattern shapes by, for example, forming an opening.

The group of the printed boards 60 used for the layer 20H is prepared by using a build-up method or a laminating method. The prepared group of the printed boards 60 is assembled into a box shape so that the layer 20 H is formed. Different printed boards 60 are fixed to each other by various methods such as adhesion using an adhesive, fusion using heat, fitting, and screwing.

In the electronic device 1H, the respective surfaces of the layer 20H formed to enclose the electromagnetic wave radiator 10 are formed by the printed boards 60. The layer 20H has the structure in which the insulating layer 61 in the group of the printed boards 60 serves as the enclosing layer that encloses the electromagnetic wave radiator 10, and the metal film 62 is formed on the surface of the enclosing layer. In the layer 20 H, the electromagnetic waves radiated from the electromagnetic wave radiator 10 are absorbed by the metal film 62 of the printed boards 60. By adjusting the thickness of the insulating layer 61, the printed boards 60 may be caused to function as a λ/4 type electromagnetic wave absorber. When the insulating layer 61 contains a carbon material, the efficiency of the absorption of the electromagnetic waves radiated from the electromagnetic wave radiator 10 may be improved.

In addition, in the electronic device 1H, the layer 20H may be used as a housing for accommodating the electromagnetic wave radiator 10. In addition, in order to implement the absorption of the plurality of frequency components of the electromagnetic waves radiated from the electromagnetic wave radiator 10, the layer 20H may be further enclosed by another layer of which respective surfaces are formed by printed boards, or another layer including an enclosing layer and a metal film formed on the surface of the enclosing layer. In addition, the layer 20H may enclose a structure in which the electromagnetic wave radiator 10 is enclosed by another layer including an enclosing layer and a metal film formed on the surface of the enclosing layer.

Figure 15A:
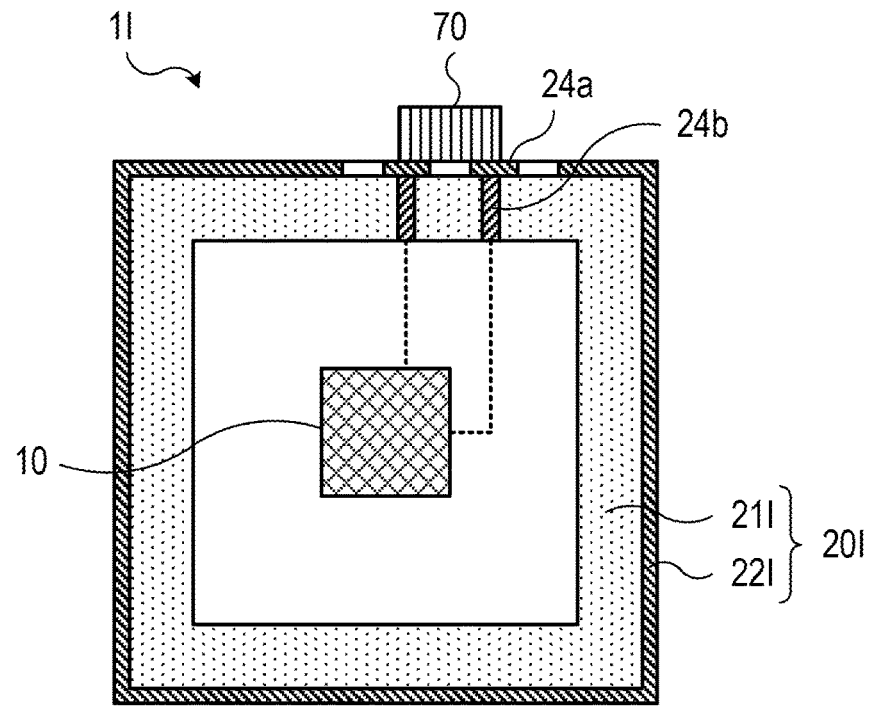
FIGS. 15A and 15B are views illustrating an example of a configuration of an electronic device according to an eighth embodiment.
Figure 15B:
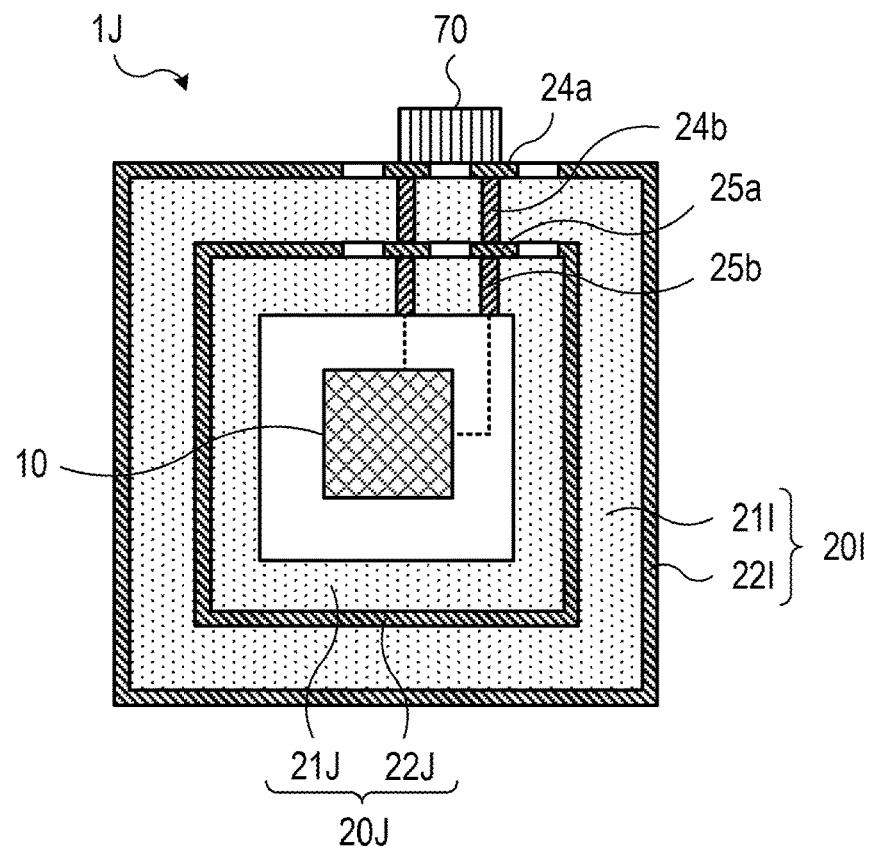

Next, an eighth embodiment will be described. FIGS. 15A and 15B are views illustrating an example of a configuration of an electronic device according to the eighth embodiment. Each of FIGS. 15A and 15B schematically illustrates a sectional view of the main part of the electronic device.

As illustrated in FIG. 15A, an electronic device 1I includes the electromagnetic wave radiator 10, a layer 20I formed to enclose the electromagnetic wave radiator 10, and an electronic circuit 70 (an electronic element) mounted on the layer 20I. As for the electronic circuit 70, various electronic components such as a semiconductor device, a circuit board, a semiconductor device in which a semiconductor element is mounted on a circuit board, a resistance element, and a capacitive element, may be used.

The layer 20I is an example of an electromagnetic wave absorber, and includes a first enclosing layer 21I that encloses the electromagnetic wave radiator 10, and a metal film 22I formed on the surface of the first enclosing layer 21I. As for the first enclosing layer 21I, various insulating materials, e.g., resin materials such as ABS resin and epoxy resin are used. The first enclosing layer 21I may contain various fillers such as a carbon material. The thickness of the first enclosing layer 21I may be set to (2m−1)/4 times (m is a natural number) the wavelength of the electromagnetic waves radiated from the electromagnetic wave radiator 10 and propagating inside the first enclosing layer 21I. As for the metal film 22I, various metal materials such as, for example, metal materials such as aluminum or alloy materials such as nickel chromium are used. The metal film 22I may have various pattern shapes by, for example, forming an opening.

The metal film 22I is provided with a terminal 24a on which the electronic circuit 70 is mounted. For example, the terminal 24a, or the terminal 24a and a pattern electrically coupled to the terminal 24a are separated from the other parts. Thus, the currents flowing when the electromagnetic waves are incident on the other parts are suppressed from affecting the electronic circuit 70.

The first enclosing layer 21I is provided with an electrode 24b which is coupled to the terminal 24a. For example, a via is provided as the electrode 24b to penetrate the first enclosing layer 21I. The electrode 24b is coupled to a predetermined terminal of the electromagnetic wave radiator 10 which includes a circuit board and an electronic component such as a semiconductor element mounted on the circuit board (indicated by a dashed line in FIG. 15A). The connection between the electrode 24b and the predetermined terminal of the electromagnetic wave radiator 10 may be implemented by various electrical methods such as a wire and a lead.

In addition, in the electronic device 1I, the filling layer 40 may be formed between the electromagnetic wave radiator 10 and the layer 20I, as described above in the fifth embodiment (FIGS. 12A and 12B). In this case, a via may be provided to penetrate the filling layer 40 such that the electrode 24b and the predetermined terminal of the electromagnetic wave radiator 10 may be coupled to each other by the via.

As described above, when the electrode 24b coupled to the terminal 24a on which the electronic circuit 70 is mounted and the predetermined terminal of the electromagnetic wave radiator 10 are coupled to each other, for example, a power supply from the electromagnetic wave radiator 10 to the electronic circuit 70 and a signal transmission between the electronic circuit 70 and the electromagnetic wave radiator 10 (the electronic component thereof) are performed.

As in the electronic device 1I, the electronic circuit 70 may be mounted on the layer 20I that absorbs the electromagnetic waves from the electromagnetic wave radiator 10. In addition, an electronic device 1J illustrated in FIG. 15B is different from the electronic device 1I in that the electronic device 1J further includes a layer 20J including a metal film 22J and a third enclosing layer 21J, in the inner side of the first enclosing layer 21I on which the metal film 22I is formed. The layer 20J is an example of an electromagnetic wave absorber.

As for the third enclosing layer 21J, various insulating materials such as, for example, resin materials such as ABS resin or epoxy resin are used. The third enclosing layer 21J may contain various fillers such as a carbon material. The thickness of the third enclosing layer 21J may be set to (2m−1)/4 times (m is a natural number) the wavelength of the electromagnetic waves radiated from the electromagnetic wave radiator 10 and propagating inside the third enclosing layer 21J. As for the metal film 22J, various metal materials such as, for example, metal materials such as aluminum or alloy materials such as nickel chromium are used. The metal film 22J may have various pattern shapes by, for example, forming an opening.

The metal film 22J is provided with a terminal 25a. For example, the terminal 25a, or the terminal 25a and a pattern electrically coupled to the terminal 25a are separated from the other parts. Thus, the currents flowing when the electromagnetic waves are incident on the other parts may be suppressed from affecting the electronic circuit 70.

The third enclosing layer 21J is provided with an electrode 25b which is coupled to the terminal 25a. The terminal 24a provided in the metal film 22I and the electrode 24b provided in the first enclosing layer 21I are coupled to the terminal 25a provided in the metal film 22J and the electrode 25b provided in the third enclosing layer 21J, and the electrode 25b is coupled to the predetermined terminal of the electromagnetic wave radiator 10 (indicated by a dashed line in FIG. 15B). The connection between the electrode 25b and the predetermined terminal of the electromagnetic wave radiator 10 may be implemented by using various electrical connection methods such as a wire and a lead.

In addition, in the electronic device 1J, the filling layer 40 may be formed between the electromagnetic wave radiator 10 and the layer 20J, as described above in the fifth embodiment (FIGS. 12A and 12B). In this case, a via may be provided to penetrate the filling layer 40 such that the electrode 25b and the predetermined terminal of the electromagnetic wave radiator 10 may be coupled to each other by the via.

As described above, when the electrode 25b coupled to the electronic circuit 70 via the terminal 24a, the electrode 24b, and the terminal 25a is coupled to the predetermined terminal of the electromagnetic wave radiator 10, power supply from the electromagnetic wave radiator 10 to the electronic circuit 70 and signal transmission between the electronic circuit 70 and the electromagnetic wave radiator 10 are performed.

As in the electronic device 1J, the layer 20J including the metal film 22J and the third enclosing layer 21J may be further formed in the inner side of the layer 20I including the metal film 22I and the first enclosing layer 21I, so that the electromagnetic waves are absorbed by the inner layer.

In addition, in the electronic devices 1I and 1J, each of the layers 20I and 20J may be used as a housing for accommodating the electromagnetic wave radiator 10. Next, a ninth embodiment will be described.

The electronic devices 1 and 1A to 1J described above in the first to eighth embodiments may be coupled to or mounted on various types of electronic equipment (also referred to as electronic devices). For example, the electronic devices 1 and 1A to 1J may be mounted on various types of equipment such as a computer (e.g., a personal computer, a super computer, or server), a smart phone, a mobile phone, a tablet terminal, a sensor, a camera, an audio device, a measuring device, an inspection device, and a manufacturing device.

FIG. 16 is an explanatory view of electronic equipment according to the ninth embodiment. FIG. 16 schematically illustrates an example of the electronic equipment. For example, the electronic device 1 described above in the first embodiment (FIG. 3) is coupled as a power supply device such as an AC adapter to various types of electronic equipment 80. The electronic device 1 converts an alternating current (AC) power input from the outside by a circuit included in the electromagnetic wave radiator 10, and outputs a direct current (DC) power to the electronic equipment 80.

In the electronic device 1, even when the electromagnetic waves are radiated from the electromagnetic wave radiator 10 at the time when the AC power is converted into the DC power, the electromagnetic waves are absorbed by the layer 20 (the first enclosing layer 21 and the metal film 22) formed to enclose the electromagnetic wave radiator 10. Thus, the radiation of the electromagnetic waves to the outside of the electronic device 1 is suppressed, and as a result, the malfunction of the electronic equipment 80 due to the electromagnetic waves and the malfunction of the electronic device 1 itself are suppressed. As a result, the electronic device 1 having the excellent performance and the high reliability and the electronic equipment 80 using the electronic device 1 are implemented.

In addition, the other electronic devices 1A to 1J described above in the first to eighth embodiments may also be coupled to or mounted on various types of electronic equipment.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiment(s) of the present disclosure has (have) been described in detail, it should be understood that the various changes, substitutions, and alterations could be made hereto without departing from the spirit and scope of the disclosure.

What is claimed is:

1. An electromagnetic wave absorber comprising:
   a first layer having a first enclosing layer that encloses an electromagnetic wave radiator from all directions, and a first metal film formed over the first enclosing layer,
   wherein the first metal film has one of a shape having a surface roughness, an uneven shape having a concave portion and a convex portion, and a gentle sloping shape, and
   a slit is formed as an opening in the first metal film.

2. The electromagnetic wave absorber according to claim 1, wherein the first layer includes a second enclosing layer formed over an opposite surface of the first metal film other than a surface of the first metal film where the first enclosing layer is formed.

3. The electromagnetic wave absorber according to claim 1, further comprising: an electronic circuit mounted over the first metal film.

4. The electromagnetic wave absorber according to claim 1, wherein the first metal film is electrically coupled to the electromagnetic wave radiator.

5. The electromagnetic wave absorber according to claim 1, wherein the first metal film has a coiled pattern that is wound around the electromagnetic wave radiator.

6. The electromagnetic wave absorber according to claim 1, wherein the first enclosing layer contains resin.

7. The electromagnetic wave absorber according to claim 1, wherein the first enclosing layer contains a carbon material.

8. The electromagnetic wave absorber according to claim 1, wherein a thickness of the first enclosing layer is $(2m-1)/4$ times (m is a natural number) a wavelength of electromagnetic waves propagating inside the first enclosing layer.

9. The electromagnetic wave absorber according to claim 1, further comprising: a second layer having a third enclosing layer that encloses the first layer, and a second metal film formed on the third enclosing layer.

10. The electromagnetic wave absorber according to claim 1, wherein one or more resistance elements is provided over the slit.

11. An electronic device comprising:
    an electromagnetic wave radiator configured to radiate electromagnetic waves; and
    an electromagnetic wave absorber configured to enclose the electromagnetic wave radiator;
    wherein the electromagnetic wave absorber includes a first layer having a first enclosing layer that encloses the electromagnetic wave radiator from all directions, and a first metal film formed over a surface of the first enclosing layer,
    the first metal film has one of a shape having a surface roughness, an uneven shape having a concave portion and a convex portion, and a gentle sloping shape, and
    a slit is formed as an opening in the first metal film.

12. The electronic device according to claim 11, wherein the first metal film has a lower resistivity than a resistivity of ferrite.

13. The electronic device according to claim 11, wherein the first metal film has a lower resistivity than a resistivity of ferrite.

14. The electronic device according to claim 11, wherein one or more resistance elements is provided over the slit.

* * * * *